US012627212B2

(12) United States Patent
Kaufmann et al.

(10) Patent No.: US 12,627,212 B2
(45) Date of Patent: May 12, 2026

(54) SLEW-RATE CONTROL FOR POWER STAGES

(71) Applicant: TEXAS INSTRUMENTS INCORPORATED, Dallas, TX (US)

(72) Inventors: Maik Peter Kaufmann, Freising (DE); Stefan Herzer, Marzling (DE); Michael Lueders, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 110 days.

(21) Appl. No.: 17/956,100

(22) Filed: Sep. 29, 2022

(65) Prior Publication Data

US 2024/0113611 A1 Apr. 4, 2024

(51) Int. Cl.
*H02M 1/00* (2007.01)
*H02M 3/158* (2006.01)
*H03K 17/16* (2006.01)

(52) U.S. Cl.
CPC ....... *H02M 1/0029* (2021.05); *H02M 3/1584* (2013.01); *H03K 17/163* (2013.01); *H03K 2217/0063* (2013.01); *H03K 2217/0072* (2013.01)

(58) Field of Classification Search
CPC .............. H02M 1/0029; H02M 3/1584; H03K 17/163; H03K 2217/0063
See application file for complete search history.

(56) References Cited

U.S. PATENT DOCUMENTS

| | | | | |
|---|---|---|---|---|
| 6,025,705 A | * | 2/2000 | Nguyen | .............. H02M 3/1588 363/17 |
| 11,038,502 B1 | * | 6/2021 | Xie | .......................... H02M 1/08 |
| 2017/0214342 A1 | * | 7/2017 | Braun | .................. H03K 17/166 |
| 2024/0022244 A1 | * | 1/2024 | S | .......................... H02M 1/0029 |
| 2024/0146298 A1 | * | 5/2024 | Magod Ramakrishna | .................. H03K 5/13 |
| 2024/0250672 A1 | * | 7/2024 | Khayat | .................... H03K 5/08 |
| 2025/0070635 A1 | * | 2/2025 | Blecic | ................. H02M 1/0025 |

OTHER PUBLICATIONS

Lobsiger et al., Closed-Loop di/dt and dv/dt IGBT Gate Drive Concepts, Power Electronic Systems Laboratory, Jun. 6-7, 2013, 64 pages.

* cited by examiner

*Primary Examiner* — Kyle J Moody
(74) *Attorney, Agent, or Firm* — Zhenhai Fu; Frank D. Cimino

(57) ABSTRACT

A circuit includes a half-bridge circuit is configured to provide a switching voltage responsive to respective high-side and low-side drive signals. High-side slew control circuitry is configured to provide a high-side slew-compensated control signal responsive to a high-side enable signal and a slew current signal representative of a slew rate at a switching output. A high-side driver is configured to provide the high-side drive signal responsive to the high-side slew-compensated control signal. Low-side slew control circuitry is configured to provide a low-side slew-compensated drive signal responsive to a low-side enable signal and the slew current signal. A low-side driver is configured to provide the low-side drive signal responsive to the low-side slew-compensated control signal. A capacitor is coupled between the high-side and low-side slew control circuitry and is configured to convert the slew rate to the slew current signal.

26 Claims, 17 Drawing Sheets

1700

EN_HS '0' → '1'

1702 — WAIT FOR "LS OFF" CONFIRMATION

1704 — SHIFT EN_HS TO HS

1706 — SET IG_ON TO HIGH VALUE

1708 — SENSE SLEW RATE

1710 — VSW RISING? — NO

YES

1712 — PERFORM SLEW RATE CONTROL

1714 — SENSE VGS_HS

VGS_HS ~ VDRV?

1716 — YES

1718 — HOLD GATE HIGH

SLEW-RATE CONTROL FOR POWER STAGES

TECHNICAL FIELD

This description relates to slew-rate control for power stages.

BACKGROUND

Power converters are used in variety of applications to supply electrical power. As an example, switching regulators include an arrangement of switches, such as power transistors, configured to convert electrical power from one form to another and provide a regulated voltage at an output terminal. The switching regulator is designed to maintain the regulated output voltage over a range of operating conditions, including at startup as well as under changing load conditions. Some applications specify maximum or minimum slew rates to control the speed of signal transitions for ensuring operation within expected operating parameters. Accordingly, circuits can implement slew rate control to reduce switching losses and to satisfy slew rate limits for a given application.

SUMMARY

One described example circuit includes high-side slew control circuitry having a high-side sense input and a high-side control output. A high-side driver has a high-side drive input and a high-side drive output. The high-side drive input is coupled to the high-side control output. A high-side transistor has a high-side control input and a high-side output. The high-side control input coupled to the high-side drive output. Low-side slew control circuitry has a low-side sense input and a low-side control output. A low-side driver has a low-side drive input and a low-side drive output. The low-side drive input is coupled to the low-side control output. A low-side transistor has a low-side control input, a ground input and a low-side output. The low-side control input is coupled to the low-side drive output, and the low-side output is coupled to the high-side output. A capacitor is coupled between the high-side sense input and the low-side sense input.

Another example circuit includes a half-bridge circuit, high-side slew control circuitry, low-side slew control circuitry, high-side driver and a low-side driver. The half-bridge circuit is configured to provide a switching voltage at a respective switching output responsive to respective high-side and low-side drive signals. The high-side slew control circuitry is configured to provide a high-side slew-compensated control signal responsive to a high-side enable signal and a slew current signal representative of a slew rate at the switching output. The high-side driver is configured to provide the high-side drive signal responsive to the high-side slew-compensated control signal. The low-side slew control circuitry is configured to provide a low-side slew-compensated drive signal responsive to a low-side enable signal and the slew current signal. The low-side driver is configured to provide the low-side drive signal responsive to the low-side slew-compensated control signal. A capacitor is coupled between the high-side and low-side slew control circuitry, and the capacitor configured to convert the slew rate to the slew current signal.

Another described example includes a system. A bridge circuit has a high-side control input, a low-side control input and a switching output. An inductor is coupled between the switching output and an output terminal. High-side slew control circuitry has a high-side sense input and a high-side control output. A high-side driver has a high-side drive input and a high-side drive output. The high-side drive input is coupled to the high-side control output, and the high-side drive output is coupled to the high-side control input. Low-side slew control circuitry has a low-side sense input and a low-side control output. A low-side driver has a low-side drive input and a low-side drive output. The low-side drive input is coupled to the low-side control output, and the low-side drive output is coupled to the low-side control input. A capacitor coupled between the high-side sense input and the low-side sense input.

DETAILED DESCRIPTION

This description relates to systems and circuits configured to control slew rate for power stages, such as half-bridge power stages.

As an example, a circuit includes high-side and low-side transistors arranged as a half-bridge power stage having a switching output. The high-side and low-side transistors are configured to provide a switching voltage at the switching output responsive to respective high-side and low-side drive signals. A high-side control circuit includes high-side slew control circuitry and a high-side driver. The high-side slew control circuitry is configured to provide a high-side slew-compensated control signal responsive a high-side enable signal and a slew current signal, which is representative of the slew rate at the switching output. For example, the high-side slew control circuitry includes a sensor circuit configured to provide a high-side sense signal responsive to the slew current signal. The high-side slew control circuitry can further provide the slew compensated signal to adjust the slew rate during a high-side switching transition (e.g., turn on or turn off) responsive to the high-side sense signal having a value representative of a rising or falling switching voltage. The high-side driver is configured to provide a high-side drive signal responsive to the high-side slew-compensated control signal.

A low-side control circuit similarly includes low-side slew control circuitry and a low-side driver. The low-side slew control circuitry is configured to provide the low-side slew-compensated drive signal responsive to a low-side enable signal and the slew current signal. For example, the low-side slew control circuitry includes a sensor circuit configured to provide a low-side sense signal responsive to the slew current signal. The low-side slew control circuitry can further provide the slew compensated signal to adjust the slew rate during a low-side switching transition (e.g., turn on or turn off) responsive to the low-side sense signal having a value representative of a rising or falling switching voltage during the switching transition. The low-side driver is configured to drive the low-side transistor responsive to the low-side slew-compensated control signal. The circuit also includes a capacitor coupled between the high-side and low-side slew control circuitry, and the capacitor is configured to convert the slew rate to the slew current signal.

Figure 1:
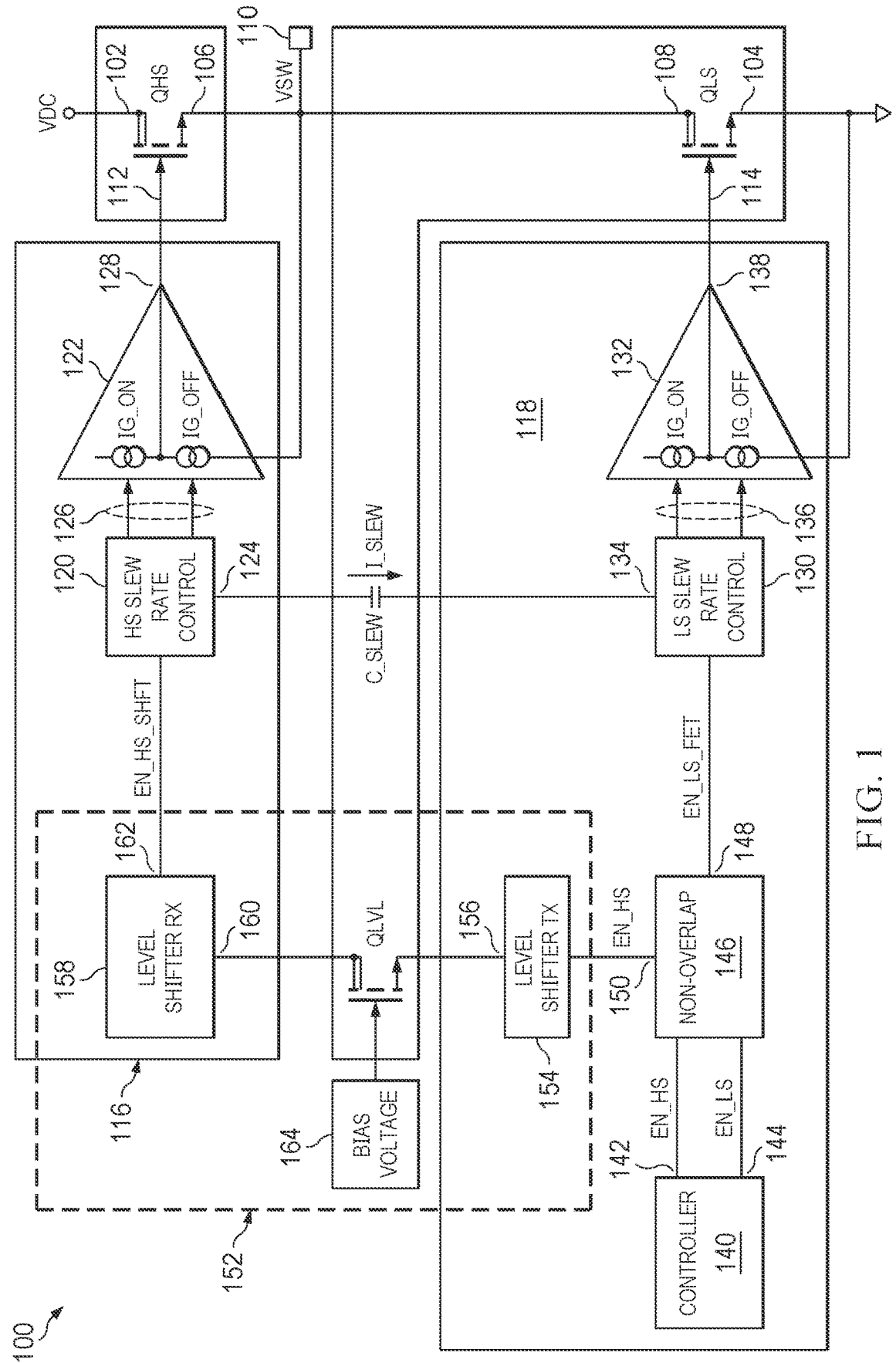
FIG. 1 is a block diagram of an example power converter circuit.

FIG. 1 is a block diagram showing an example power circuit 100. The power circuit 100 includes a half-bridge power stage having a high-side transistor QHS and a low-side transistor QLS. QHS and QLS are coupled between first and second voltage terminals, shown as an input supply terminal 102 and a ground terminal 104. The supply terminal 102 can be adapted to be coupled to a DC supply voltage source (VDC), and the ground terminal 104 can be coupled to a ground. Respective output terminals 106 and 108 of QHS and QLS can be coupled together to provide a switching output 110 of the circuit 100. Each of QHS and QLS has a respective control input (e.g., a gate) 112 and 114. In the example of FIG. 1, the high-side and low-side transistors are implemented as power field effect transistors (FETs), such as n-channel FETs (NFETs). In other examples different types of transistors may be used, such as p-channel FETs, insulated-gate bipolar transistors (IGBTs), bipolar junction transistors (BJTs), laterally-diffused metal-oxide semiconductor (LDMOS) transistors, and the like. As a further example, each of QHS and QLS can be fabricated as gallium nitride (GaN) FETs using a GaN fabrication technology.

The circuit 100 also includes a high-side control circuit 116 and a low-side control circuit 118. The high-side control circuit 116 includes high-side slew control circuitry 120 and a high-side driver 122. The high-side slew control circuitry 120 has a high-side sense input 124 and one or more high-side control outputs 126. The high-side driver 122 has one or more high-side drive inputs and a high-side drive output 128. The high-side drive input is coupled to the high-side control output 126, and the high-side drive output 128 is coupled to the control input 112 (e.g., the gate) of QHS. The high-side slew control circuitry 120 is configured to provide a high-side slew-compensated control signal at output 126 responsive a high-side enable signal (EN_HS) and a sensed slew rate at the sense input. EN_HS can encode a command to turn on or turn off QHS.

In one example, the high-side slew control circuitry 120 can implement one or more discrete levels of slew control according to sensed slew rate. In another example, the high-side slew control circuitry 120 can implement continuous (e.g., analog) slew control according to sensed slew rate. The slew current signal I_SLEW is representative of slew rate at the switching output 110, and flows through a slew capacitor C_SLEW coupled between the high-side and low-side control circuitry 120 and 130. In the examples described herein, a positive slew current I_SLEW means current flowing from the high-side to the low-side through C_SLEW, such as shown in FIG. 1. The high-side driver 122 is configured to provide a high-side drive signal responsive to the high-side slew-compensated control signal. In an example, the high-side driver 122 includes variable current sources configured to supply drive current to the control input of QHS responsive to the high-side slew-compensated control signal and a high-side enable signal.

The low-side control circuit 118 includes low-side slew control circuitry 130 and a low-side driver 132. The low-side slew control circuitry 130 has a low-side sense input 134 and one or more high-side control outputs 136. The low-side driver 132 has one or more low-side drive inputs and a low-side drive output 138. The low-side drive input is coupled to the low-side control output 136. The low-side slew control circuitry 130 is configured to provide a low-side slew-compensated control signal at output 136 responsive a low-side enable signal (EN_LS) and the slew current signal I_SLEW. EN_LS can encode a command to turn on or turn off QLS.

In the example of FIG. 1, capacitor C_SLEW is coupled between the high-side sense input 124 and the low-side sense input 134. For example, C_SLEW is configured as a linear capacitor to provide a measure of slew rate to each of the high-side and low-side control circuits 116 and 118. The high-side and low-side slew control circuitry 120 and 130 thus use the slew current signal I_SLEW to sense slew rate and implement controls to adjust the slew rate. The low-side driver 132 is configured to provide a low-side drive signal responsive to the low-side slew-compensated control signal at 136. For example, the low-side driver 122 includes variable current sources configured to supply drive current to the control input of QLS responsive to the low-side slew-compensated control signal and EN_LS. The half-bridge circuit is configured to provide a switching voltage VSW at the switching output 110 responsive to respective high-side and low-side drive signals.

The circuit 100 also includes a controller 140 configured to provide respective enable signals EN_LS and EN_HS. In the example of FIG. 1, the controller 140 is implemented in the low-side control circuit 118. In other examples, the controller 140 is implemented as a separate circuit or in the high-side control circuit 116. The controller 140 has outputs 142, 144 coupled to respective inputs of a non-overlap circuit 146. The non-overlap circuit 146 has a low-side output 148 and a high-side output 150. The low-side output 148 is coupled to an enable input of the low-side slew control circuitry 130. The high-side output 150 is coupled to an input of a communication interface 152. The non-overlap circuit 146 can be implemented by logic (or other circuitry) configured to provide enable output signals EN_LS_FET and EN_HS having relative timing to ensure that QHS and QLS are not on simultaneously. For example, the non-overlap circuit 146 includes cross-coupled NAND gates with respective delays configured to ensure that the EN_LS_FET and EN_HS do not overlap.

The communication interface 152 includes a transmit level shifter 154 having an input coupled to the output 150 of the non-overlap circuit 146. The transmit level shifter 154 has an output 156 coupled to a receive level shifter 158 in the high-side control circuit 116. In the example of FIG. 1, a transistor QLVL is coupled between the output 156 of the transmit level shifter 154 and an input 160 of the receive level shifter 158. QLVL can be a FET (e.g., NFET) having a control input (e.g., gate) coupled to a DC bias voltage source 164 to maintain a communications link between level shifters 154 and 158 during operation. The receive level shifter 158 has an output 162 coupled to the input of the high-side slew rate control circuitry 120. The communication interface 152 is thus configured to communicate the high-side enable signal from the non-overlap circuit 146 of the low-side control circuit 118 to the receive level shifter 158 of the high-side control circuit 116. The receive level shifter 158 is configured to convert the received enable signal to a level-shifted high-side enable signal EN_HS_SHFT, which is provided to at 162 to the high-side slew control circuitry 120.

The communication interface 152 can be used in examples where the high-side control circuit 116 is implemented on a different IC die from the where the controller 140 is located. In the example of FIG. 1, the low-side control circuit 118 is on one IC die and the high-side control circuit 116 is on another IC die. The high-side transistor QHS can be implemented on a different IC die from the high-side control circuit 116, or QHS can be on the same IC die as the high-side control circuit 116. Also, the low-side transistor QLS can be on a different IC die from the low-side control circuit 118 or QLS and the low-side control circuit 118 can be implemented on the same IC die. In one example, the capacitor C_SLEW, QLVL and QLS are implemented on the same IC die (e.g., a low side die), which can be fabricated using GaN or another fabrication process technology (e.g., Si or SiC). In another example, the entire circuit 100 is integrated in the same package, such as including one or more dies in a system on chip (SoC).

Figure 2:
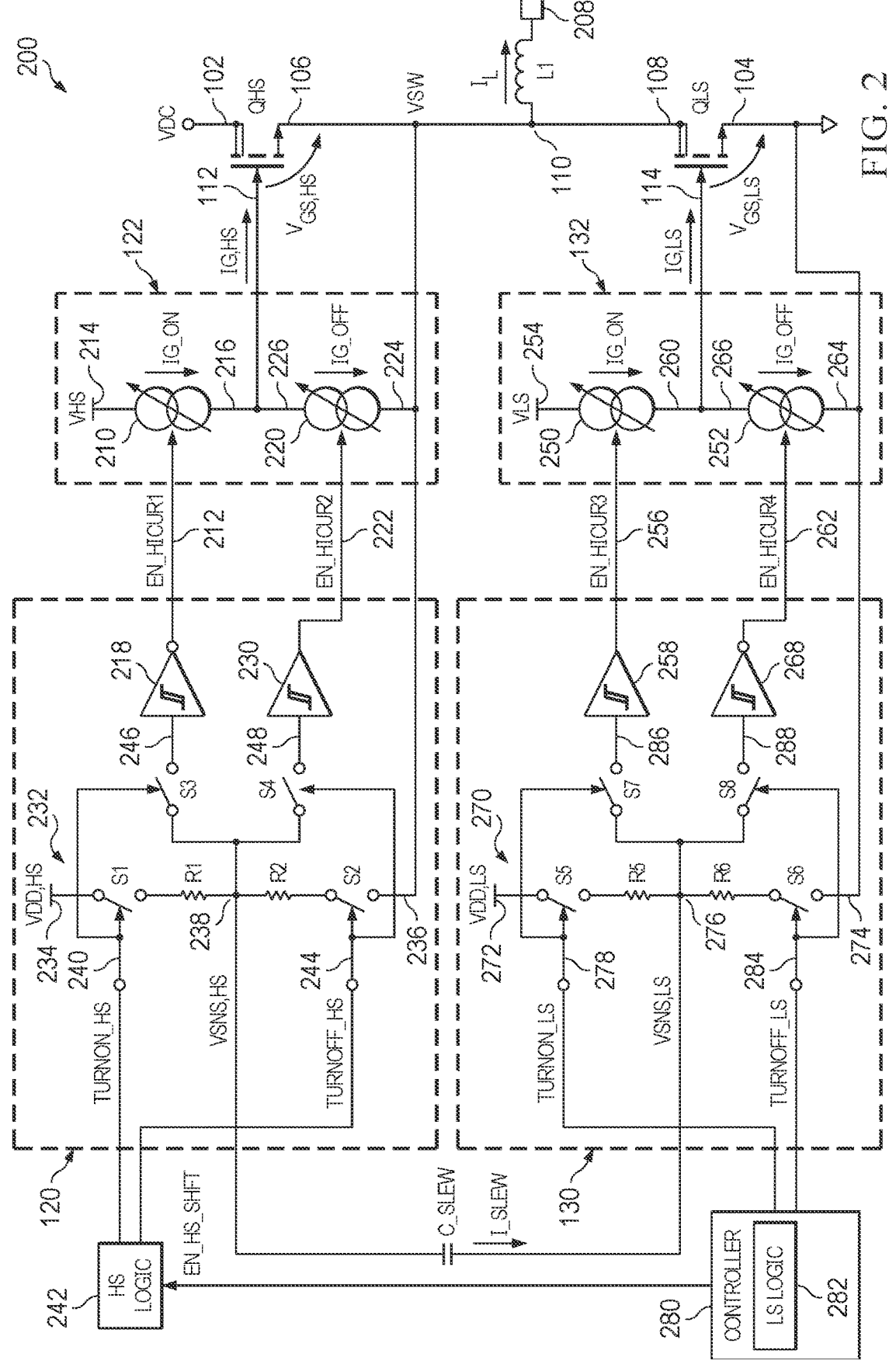
FIG. 2 illustrates an example power converter circuit.

FIG. 2 shows an example power circuit 200. The power circuit 200 can be used to implement the circuit 100 of FIG. 1. Accordingly, the description of FIG. 2 also refers to FIG. 1. The power circuit 200 includes a power stage (e.g., a half-bridge stage) having transistors QHS and QLS (e.g., respective NFETs) coupled between an input supply terminal 102 and a ground terminal 104. The supply terminal 102 can be adapted to be coupled to VDC, and the ground terminal 104 can be coupled to ground. Respective output terminals 106 and 108 of QHS and QLS are each coupled to a switching output 110 of the circuit 100. Each of QHS and QLS also has a respective control input (e.g., a gate) 112 and 114. As described herein, high-side and low-side drivers 122 and 132 have driver outputs coupled to the respective control inputs 112 and 114. The drivers 122 and 132 are configured to provide drive signals to control the switching operation (e.g., turn on and turn off) of QHS and QLS, respectively. The half-bridge circuit is configured to provide a switching voltage VSW at the switching output 110 responsive to respective high-side and low-side drive signals provided at 112 and 114, respectively. The switching voltage VSW at 110 varies between ground and VDC responsive to QHS and QLS turning on and off. In the example of FIG. 2, an inductor L1 is coupled between the switching output 110 and a circuit output 208, which is adapted to be coupled to a load (now shown). An inductor current IL flows through the inductor L1 responsive to the switching operation of QHS and QLS.

In the example of FIG. 2, the high-side driver 122 includes a first current source 210 having a current control input 212, a bias input 214 and a current output 216. The current control input 212 is coupled to an output of a buffer 218 of the high-side slew control circuitry 120. The buffer 218 can be implemented as a Schmitt trigger configured to provide an enable signal to the current control input 212 for turning on QHS. The amount of current commanded can be responsive to a high-side sense signal VSNS,HS provided at 238. As described herein, the high-side sense signal VSNS, HS is representative of the slew rate of VSW at the switching output 110. The buffer 218 is configured to provide a current enable signal to control the current source 210 responsive to VSNS,HS. In one example, the buffer 218 is configured to command a high current enable signal (EN_HICUR1) to command a high current or a low current enable signal (EN_LOCUR1) to command a low current responsive to VSNS,HS. For sake of clarity in drawing of FIG. 2, only EN_HICUR1 is shown. In other examples, the buffer 218 (or other circuitry) is configured to implement different levels of current control, such as more than two discrete current levels or a range of continuous current control, such as to provide more granular slew rate adjustments. The bias input 214 is coupled to a high-side DC bias terminal, which is adapted to be coupled to voltage supply that provides a high-side DC bias voltage (VHS). The current output 216 is coupled to the high-side control input 112. The current source 210 is configured to provide a high-side turn on current (IG_ON) at the current output 216 to turn on QHS responsive to the current command signal EN_HICUR1 or EN_LOCUR1.

The high-side driver 122 also includes a second current source 220 having a control input 222, a current output 224 and a current input 226. The current output 224 is coupled to switching output 110 and the current input 226 is coupled to the gate 112 of QHS. The control input 222 is coupled to an output of a buffer (e.g., a Schmitt trigger) 230 of the high-side slew control circuitry 120, and the buffer is configured to provide an enable signal to the current control input 222 for turning on QHS. The amount of current commanded can be responsive to the high-side sense signal VSNS,HS at 238. In one example, buffer 230 is configured to provide a high current enable signal (EN_HICUR2) to command a high current or a low current enable signal (EN_LOCUR2) to command a low current responsive to VSNS,HS and the high-side enable signal. For sake of clarity in drawing of FIG. 2, only EN_HICUR2 is shown. In other examples, the buffer 230 is configured to implement different levels of current control, such as more than two discrete levels or continuous current control to provide more granular slew rate adjustments. The current source 220 is configured to sink a high-side turn off current (IG_OFF) from the gate 112 to turn off QHS, which can be a high or low sink current value, such as responsive to the current command signal EN_HICUR2 or EN_LOCUR2 from the buffer 230.

The high-side slew control circuitry 120 includes a high-side sense circuit 232 having first and second voltage inputs 234 and 236. The first voltage input 234 can be coupled to (or adapted to be coupled to) a voltage source configured to provide a supply voltage, shown as VDD,HS. As used herein, all high-side (HS) voltages are referred to the switching voltage VSW, and all low-side (LS) voltages are referred to ground. For example, the supply voltage VDD,HS is a defined supply voltage referred to VSW, and the supply voltage VDD,LS (at 272) is referred to ground. Other HS and LS voltages are similarly referred. The second voltage input 236 is coupled to the high-side output terminal 106, which is coupled to the switching output 110. Thus, the input 236 receives the switching voltage VSW. In the example of FIG. 2, the high-side sense circuit 232 includes a first switch S1 coupled in series with a first resistor R1 between the first voltage input 234 and a high-side sense input 238. A second switch S2 is coupled in series with a second resistor R2 between the high-side sense input 238 the second voltage input 236. The switch S1 has a control input 240 coupled to an output of high-side logic (HS LOGIC) 242, and switch S2 has a control input coupled to another output of the HS LOGIC. The HS LOGIC 242 is configured to provide a control signal (TURNON_HS) to the control input 240 and another control signal (TURNOFF_HS) to the other control input 244 responsive to the high-side enable signal EN_HS_SHFT. The switches S1 and S2 are thus configured to control VSNS,HS at the high-side sense input 238 responsive to the control signals TURNON_HS and TURN-OFF_HS provided by the HS LOGIC 242 and current through the capacitor C_SLEW. As described herein, the current through the capacitor C_SLEW is a slew current (I_SLEW) representative of slew rate at the switching output 110. The slew current I_SLEW varies as a function of the capacitance C_SLEW and changes in VSW with respect to time, such as can be expressed as follows:

$$I\_SLEW = C\_SLEW * dVSW/dt.$$

A switch S3 is coupled between the high-side sense input 238 and an input 246 of the buffer 218. Another switch S4 is coupled between the high-side sense input 238 and an input 248 of the buffer 230. The switch S3 has a control input coupled to the control input 240 to receive the TURN-ON_HS signal. The switch S4 has a control input coupled to the control input 244 to receive the TURNOFF_HS signal. As a result, S3 or S4 is configured to supply the high-side sense voltage signal VSNS,HS to control turn on or turn off of QHS responsive to which of the TURNON_HS or TURN-OFF_HS signal is provided. As described herein, the sense voltage signal VSNS,HS varies responsive to the current through the capacitor C_SLEW, which enables the high-side slew control circuitry 120 to implement slew rate control for high-side switching of QHS. Also, whether high-side slew control circuitry 120 is configured to adjust the slew rate during turn on or turn off of QHS further depends on the direction (polarity) of the inductor current IL.

The low-side driver 132 and low-side slew control circuitry 130 can be configured similar to the respective high-side components described herein. As shown in FIG. 2, the low-side driver 132 includes first and second current sources 250 and 252 coupled between the ground terminal 104 and a voltage supply, which provides a low-side DC bias voltage (VLS) at 254. The current source 250 has a current control input 256 coupled to an output of a low-side slew control buffer 258 and a current output 260 coupled to the gate 114 of QLS. The current source 252 has a control input 262, a current output 264 and a current input 266. The current output 264 is coupled to the ground terminal 104 and the current input 266 is coupled to the gate 114 of QLS. The control input 262 coupled to an output of a low-side slew control buffer 268. Each of the buffers 258 and 268 is configured to provide a respective current enable signal (EN_HICUR3 or EN_LOCUR3 and EN_HICU4 or EN_LOCUR4) to respective current control inputs 256 and 262 responsive to the low-side sense signal VSNS,LS at 276 and the low-side enable signal (EN_LS). The current source 250 is thus configured to provide a low-side turn on current (IG_ON) at the current output 216 to turn on QLS responsive to the current command signal EN_HICUR3 or EN_LOCUR_3. Similarly, the current source 252 is configured to sink a low-side turn off current (IG_OFF) from the gate 114 to turn off QLS responsive to the current command signal EN_HICUR4 or EN_LOCUR4. The current command signals can vary during a respective switching transition.

The low-side slew control circuitry 130 thus is configured to provide the current command signals EN_HICUR3/EN_LOCUR3 or EN_HICUR4/EN_LOCUR4 responsive to control signals TURNOFF_LS or TURNON_LS and responsive to a low-side sense voltage signal VSNS,LS at 276. The low-side slew control circuitry 130 includes a low-side sense circuit 270 having first and second voltage inputs 272 and 274. The first voltage input 272 is coupled to (or adapted to be coupled to) a voltage source configured to provide a supply voltage, shown as VDD,LS. The second voltage input 274 is coupled to the ground terminal 104. The low-side sense circuit 270 includes a switch S5 coupled in series with a resistor R5 between the first voltage input 272 and low-side sense input 276. Another switch S6 is coupled in series with a second resistor R6 between the low-side sense input 276 the second voltage input 274. The switch S5 has a control input 278 coupled to an output of a controller 280, which includes low-side logic (LS LOGIC) 282. The switch S6 has a control input 284 coupled to another output of the controller 280. The controller 280 also has another output coupled to an enable input of the HS logic 242. The LS LOGIC 282 is also configured to provide a turn on control signal (TURNON_LS) to the control input 278 and a turn off control signal (TURNOFF_LS) to the other control input 284. The switches S5 and S6 are thus configured to control a low-side sense voltage signal (VSNS,LS) at the low-side sense input 276 responsive the control signals TURNOFF_LS and TURNON_LS provided by the LS LOGIC 282.

The controller 280 is configured to provide the EN_HS_SHFT signal to the HS logic 242. The TURN-ON_HS and TURNOFF_HS signals are provided responsive to the EN_HS_SHFT signal. In an example where the circuit 200 is implemented across multiple dies, the controller 280 and HS logic 242 can include the communication interface 152 of FIG. 1.

The low-side slew control circuitry 130 also includes a switch S7 is coupled between the low-side sense input 276 and an input 286 of the buffer 258. The switch S7 has a control input coupled to the control input 278 to receive the TURNON_LS signal. Another switch S8 is coupled between the low-side sense input 276 and an input 288 of the buffer 268. The switch S8 has a control input coupled to the control input 284 to receive the TURNOFF_LS signal. As a result, S7 or S8 is configured to supply the low-side sense voltage signal VSNS,LS to one of the buffers 258 or 268 for controlling turn on or turn off of QLS responsive to which of the TURNOFF_LS or TURNON_LS signal is asserted.

A capacitor C_SLEW is coupled between the high-side sense input 238 and the low-side sense input 276. A top plate of the capacitor C_SLEW is thus referred to the switching voltage VSW at 110, either directly through R2 and S2 (responsive to TURNOFF_HS) or indirectly to the voltage VDD,HS at 234 through R1 and S1 (responsive to TURN-ON_HS). Also, the bottom plate of C_SLEW is referred to ground 104, either directly through resistor R6 and switch S6 or indirectly to the voltage VDD,LS at 272 through R5 and S5.

A slew current I_SLEW is generated responsive to a voltage slew applied to the capacitor C_SLEW. The voltage slew applied to C_SLEW depends on the high-side sense voltage signal VSNS,HS and the low-side sense voltage signal VSNS,LS, which are applied across C_SLEW. As described herein, the respective sense voltage signals VSNS, HS and VSNS,LS vary as a function of the operating state of the HS and LS slew control circuitry 120 and 130, which is responsive to respective control signals TURNON_HS, TURNOFF_HS, TURNON_LS and TURNOFF_LS for turning on and off QHS and QLS. The amplitude and direction of slew current I_SLEW further can charge or discharge the capacitor C_SLEW responsive to voltage slew dVSW/dt. As a result, high-side sense voltage signal VSNS, HS and the low-side sense voltage signal VSNS,LS likewise have values representative of the slew rate during respective switching transitions responsive to slew current I_SLEW. For example, VSNS,HS and VSNS,LS can be represented as follows:

$$VSNS,HS-VSW=R2*I\_SLEW=R2*C\_SLEW*dVSW/dt$$

and $$VSNS,LS-GND=R6*I\_SLEW=R6*C\_SLEW*dVSW/dt.$$

As described herein, the high-side and low-side slew control circuitry 120 and 130 are configured to control the slew rate of VSW at 110 by controlling the turn-on and turn-off speed of the transistors QHS and QLS responsive to the respective slew sense signals VSNS,HS at 238 and VSNS,LS at 276.

As a further example, assuming QLS turns off and QHS turns on, switches S1 and S6 are closed. The switching voltage VSW rises from ground to VDC, which results in a dVSW/dt being positive. Responsive to dVSW/dt being positive, slew current I_SLEW flows from the high-side to the low-side. In the example switching transition when S1 and S6 are closed, VSNS,HS and VSNS,LS can be represented as follows:

$$VSNS,LS=GND+R6*C\_SLEW*dVSW/_{dt}$$

and $$VSNS,HS=VDD,HS-(R1*C\_SLEW*dVSW/dt).$$

Thus, as described herein, the generated slew current results in VSNS,HS varying responsive to the slew rate of VSW.

In the other example when QHS is turned off and QLS is turned on, S5 and S2 are closed. The switching voltage VSW goes from VDC to ground, which results in dVSW/dt being negative. Responsive to dVSW/dt being negative, slew current I_SLEW flows from the low-side to the high-side. In the example switching transition when S2 and S5 are closed, VSNS,HS and VSNS,LS can be represented as follows:

$$VSNS,LS=VDD,LS+(R5*C\_SLEW*dVSW/dt)$$

and $$VSNS,HS=VSW-R2*C\_SLEW*dVSW/dt.$$

Because dVSW/dt is negative, the low-side sense voltage VSNS,LS has a value smaller than VDD,LS and the high-side sense voltage is at or approximates 0 V.

As described herein, the capacitor C_SLEW is configured to convert the slew rate of the switching voltage VSW to the slew current I_SLEW, which is represented by the relative sense voltages VSNS,HS and VSNS,LS. The respective sense voltages VSNS,HS and VSNS,LS are thus applied to the respective sense inputs 238 and 276 to enable slew rate control to be implemented by the slew control circuitry 120 and 130 accordingly. The slew control circuitry 120 and 130 are configured to control the slew rate at respective switching transitions of QHS and QLS responsive to which switches S1, S2, S5 and S6 are turned on or off at respective switching transitions. For the example when the inductor current is positive, the switching of QHS determines the slew rate of VSW at 110. The slew control circuitry 120 thus is configured to control the slew rate when the inductor current is positive by controlling the speed at which QHS turns on or off. For the example when the inductor current is negative (flowing from 208 to 110), the switching of QLS determines the slew rate of VSW at 110. The slew control circuitry 130 thus is configured to control the slew rate when the inductor current is negative by controlling the speed at which QLS turns on or off.

FIGS. 3, 4, 5, 6, 7, 8, 9 and 10 depict signal diagrams showing waveforms for the power circuits of FIGS. 1 and 2 for different switching transitions of QHS and QLS and for different polarities of the output current IL. The description of FIGS. 3, 4, 5, 6, 7, 8, 9 and 10 refers to FIGS. 1 and 2 and, as described above, all HS voltages are referred to VSW and all LS voltages are referred to ground. Also, the waveforms in each of the respective figures include those considered relevant to implementing the switching transition for QHS or QLS.

Figure 3:
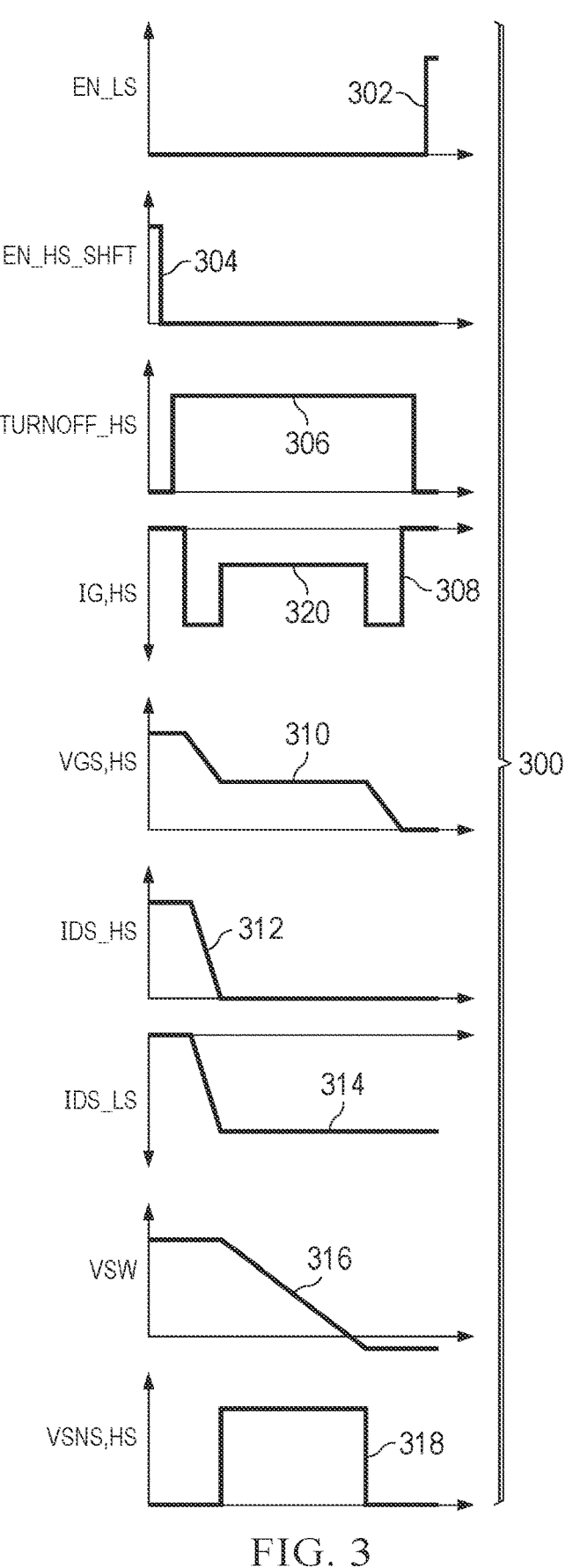
FIGS. 3, 4, 5, 6, 7, 8, 9 and 10 are signal diagrams showing examples of signals in the circuits of FIGS. 1 and 2 for different switching transitions.

FIG. 3 illustrates signal waveforms 300 for a switching transition when QHS is turned off (e.g., S2 is closed) and IL is positive (e.g., IL is flowing from 110 to 208). In FIG. 3, an enable low-side signal EN_LS 302 is low. An enable high-side shift signal EN_HS_SHFT 304 (provided by level shifter 158) goes low, which results in a turn off high-side signal TURNOFF_HS 306 (provided to control input 240) going high. The gate current signal IG,HS (at 112) goes negative, shown at 310, responsive to the signal TURN-OFF_HS 306 causing the current source 220 to sink current from the gate 112. A gate-to-source voltage for QHS, shown at VGS,HS 310 (between terminals 112 and 106) decreases responsive to the gate current signal IG,HS 308. For example, VGS,HS 310 decreases until QHS reaches its Miller plateau responsive to the negative gate current. VGS, HS 310 remains at the Miller plateau for a duration and then decreases to 0 V. The drain-to-source current IDS_HS (between terminals 102 and 106), shown at 312, decreases responsive to VGS,HS, and reaches zero (during the Miller plateau) so current is no longer flows through QHS (e.g., IDS_HS=0). Concurrently with the change in IDS_HS, inductor current IL still flows due to the low-side drain-to-source current IDS_LS 314 going negative responsive to conduction of current through the body diode of QLS. The switching voltage VSW, shown at 316, remains at about VDC until when VSW begins to decrease (e.g., during the Miller plateau of QHS shown by VGS,HS 310). Also, FIG. 3 shows the high-side sense voltage VNS_HS 318, which rises responsive to the slew current I_SLEW, where I_SLEW<0, which is detected at the buffer 230. The buffer 230 is thus configured to activate current source 230 to provide IG,OFF, which reduces IG,HS, shown at 320, until the switching voltage goes negative. VSNS,HS then goes to ground and the negative gate current IG,HS is increased.

Figure 4:
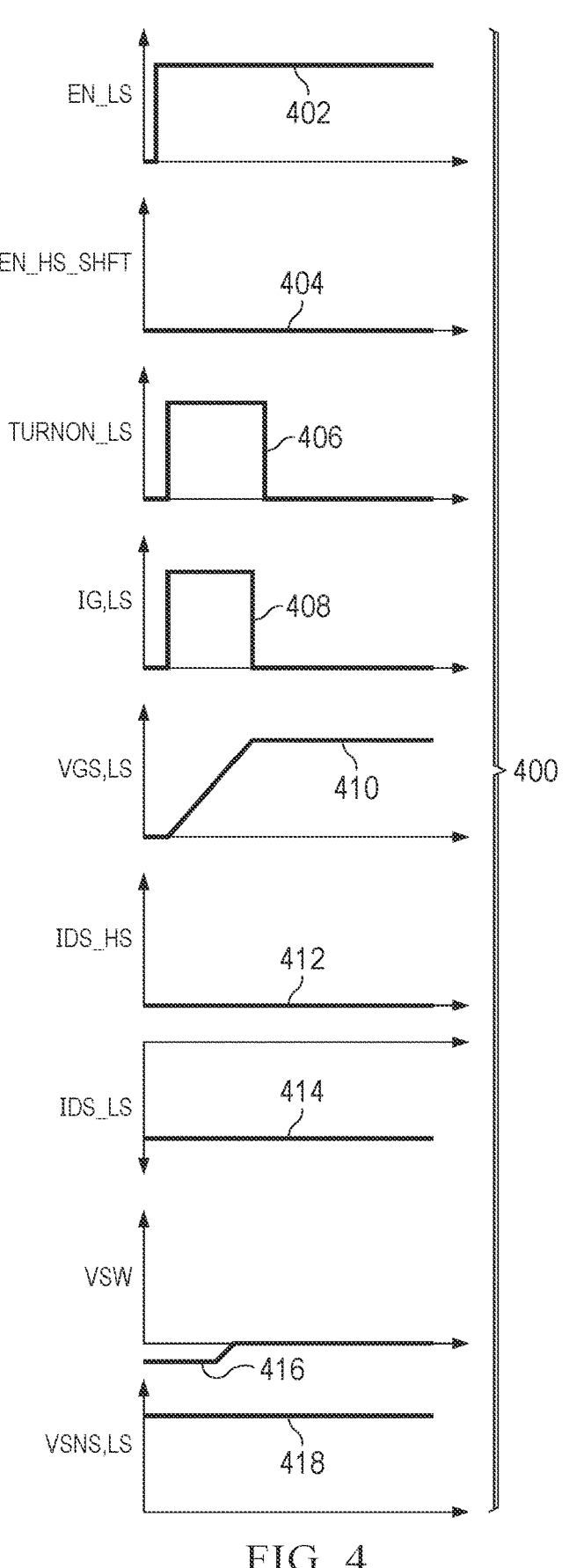

FIG. 4 illustrates signal waveforms 400 for a switching transition when QLS is turned on (e.g., S5 is closed) and IL is positive (e.g., IL is flowing from 110 to 208). In FIG. 4, an enable low-side signal EN_LS 402 (at 144) goes high. An enable high-side shift signal EN_HS_SHFT 404 (provided by level shifter 158) remains low (off). The enable low-side signal EN_LS 402 going high causes the TURNON_LS signal 406 to also go high for a duration, which results in the low-side gate current signal IG,LS (at 114) going positive, shown at 408. For example, switches S5 and S7 close responsive to the TURNON_LS signal 406, which causes the current source 250 to supply current to the gate 114. A gate-to-source voltage for QLS, shown at VGS,LS 410 (between terminals 114 and 104) increases responsive to the gate current signal IG,LS 408. The high-side drain-to-source current IDS_HS (between terminals 102 and 106), shown at 412, remains at zero during the interval shown in FIG. 4 when QLS is being turned on. Conversely, the low-side drain-to-source current IDS_LS, shown at 414, is negative due to the positive inductor current IL. The switching voltage VSW, shown at 416 goes to ground (e.g., 0V) and even below responsive to the negative inductor current when QHS is turned off (as shown in FIG. 3). QLS thus is initially operating in the third-quadrant (e.g., exhibiting quasi-body diode conduction), and VSW is at or near its proper operating voltage. The low-side sense voltage VSNS,LS, shown at 418, remains at approximately VDD,LS because S5 is closed and VSW is no longer slewing. Accordingly, slew rate control is not implemented for the conditions of FIG. 4.

Figure 5:
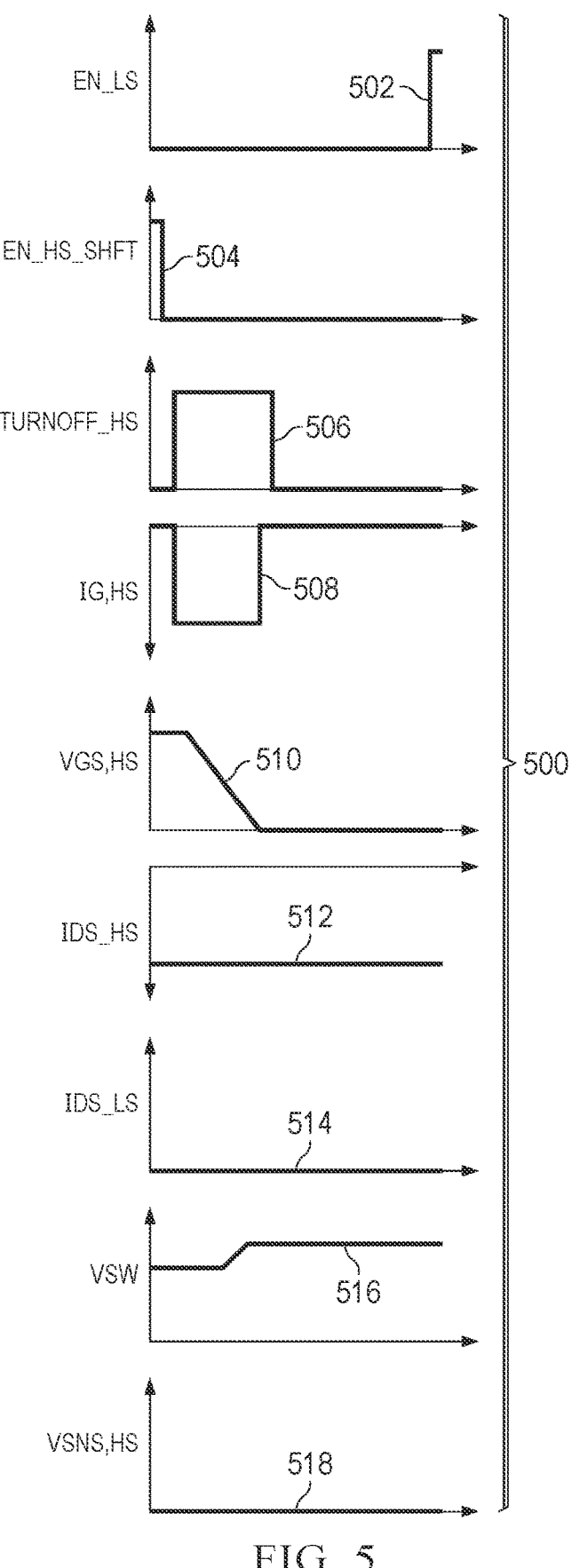

FIG. 5 illustrates signal waveforms 500 for a switching transition for a time interval when QHS turns off and IL is negative (e.g., IL is flowing from 208 to 110). In FIG. 5, the enable low-side signal EN_LS (provided at 144), shown at 502, is low until near an end of the interval, and the enable high-side shift signal EN_HS_SHFT (provided by level shifter 158), shown at 504, goes low (off), which is representative of a command to turn off QHS. The EN_HS_SHFT going low causes the TURNOFF_HS signal 506 to go high. The high-side driver 122 provides high-side gate current signal IG,HS (provided at 112) going negative, shown at 508. For example, switches S1 and S4 close responsive to the TURNOFF_HS signal 506, which causes the current source 220 to sink current from the gate 112. A high-side gate-to-source voltage VGS,HS (between terminals 112 and 106), shown at 510, decreases responsive to the negative gate current signal IG,LS 508. The high-side drain-to-source current IDS_HS (between terminals 102 and 106), shown at 512, remains negative during the interval shown in FIG. 5 when QHS is being turned off due to the negative inductor current IL. Conversely, the low-side drain-to-source current IDS_LS, shown at 514, is at zero because QLS is OFF. The switching voltage VSW, shown at 516, starts positive and increases a small amount (e.g., a diode drop) higher than VDC responsive to QHS operating in its third quadrant (e.g., quasi-body diode conduction). The high-side sense voltage VSNS,HS, shown at 518 remains at approximately ground (e.g., 0 V) because VSW does not change during this switching transition. Because VSW remains at VDD,HS or slightly higher when QHS is off, high-side slew rate control is not implemented for the conditions of FIG. 5. Instead, slew rate control will be implemented when QLS is turned on, such as shown with respect to FIG. 6.

Figure 6:
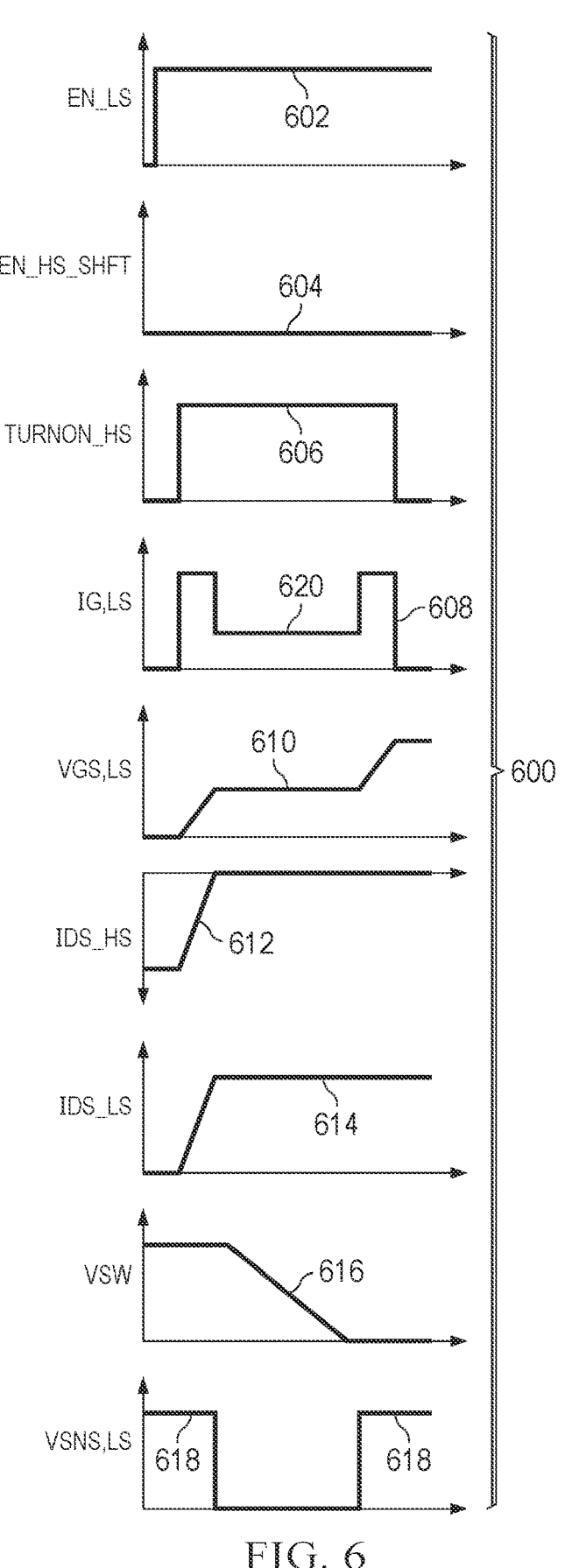

FIG. 6 illustrates signal waveforms 600 for a switching transition during a time interval when QLS is turned on and IL is negative (e.g., IL is flowing from 208 to 110). In FIG. 6, an enable low-side signal EN_LS 602 goes high, which is representative of a command to turn on QLS. An enable high-side shift signal EN_HS_SHFT (provided by level shifter 158), shown at 604, remains low during the time interval. A low-side signal TURNON_LS (provided to control input 278, shown at 606, goes high responsive to EN_LS 602 going high. For example, switches S5 and S7 close responsive to the TURNON_LS signal 606. The current source 250 is enabled to supply gate current signal IG,LS (at 114), shown at 608, responsive to the enable signal. A gate-to-source voltage for QLS, shown at VGS,LS 610 (between terminals 112 and 106), is provided responsive to the gate current signal IG,HS 608. The drain-to-source current IDS_HS (between terminals 102 and 106), shown at 612, increases from a negative current (e.g., due to negative inductor current flowing through the body diode of QHS) to zero current. Concurrently with the change in IDS_HS, the low-side drain-to-source current IDS_LS, shown at 614, increases to a positive current responsive to QLS being turned on. The switching voltage VSW 616 likewise decreases responsive to QLS being turned on. The low-side sense voltage VSNS,LS, shown at 618, is high (e.g., approximately VDD,LS) except at the Miller plateau of QLS the VGS,LS signal 610 during which VSW is decreasing is detected. For example, the decreasing VSW causes a decreasing slew current (e.g., I_SLEW=C_SLEW*dVSW/dt), which in turn leads to the signal of VSNS,LS shown at 618. As described above, the low-side sense voltage VSNS,LS=VDD,LS+R5*dVSW/dt and, in this circumstance dVSW/dt is negative (e.g., decreasing VSW). For example, the buffer 258 disables the high current IG_ON responsive to VSNS,LS being low. Thus, the low-side slew control circuitry 130 is configured to implement slew control.

Figure 7:
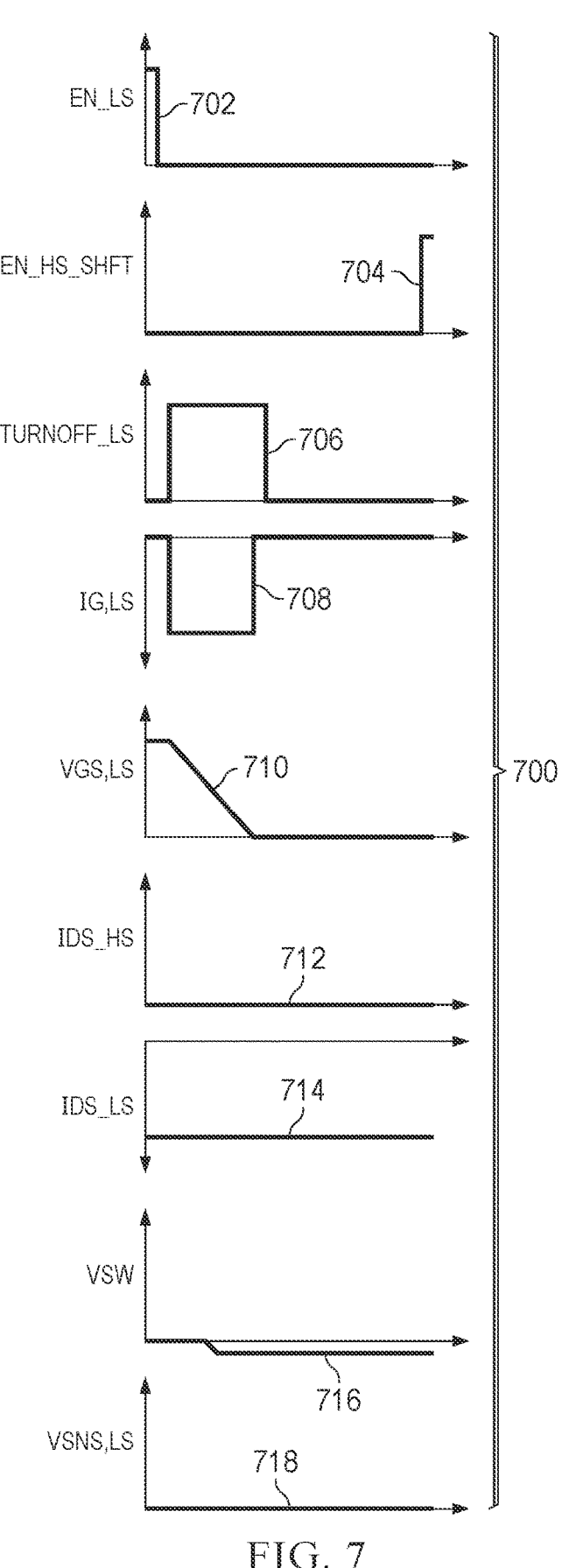

FIG. 7 illustrates signal waveforms 700 for a switching transition for a time interval when QLS turns off and IL is positive (e.g., IL is flowing from 110 to 208). In FIG. 7, the enable low-side signal EN_LS 702 (at 144) goes low (off), which is representative of a command to turn off QLS. EN_HS_SHFT 704 (provided by level shifter 158) goes low until near an end of the interval. The EN_LS going low causes the TURNOFF_LS signal 706 to go high. The low-side driver 132 provides low-side gate current signal IG,LS (provided at 114) as a negative current, as shown at 708, responsive to the TURNOFF_LS signal 706. For example, switches S6 and S8 close responsive to the TURNOFF_LS signal 706, which causes the current source 252 to sink current from the gate 114. A gate-to-source voltage for QLS, shown at VGS,LS 710 (between terminals 114 and 104) decreases responsive to the negative gate current signal IG,LS 708. The high-side drain-to-source current IDS_HS (between terminals 102 and 106), shown at 712, remains zero during the interval shown in FIG. 7 when QLS is being turned off during positive inductor current IL. Conversely, the low-side drain-to-source current IDS_LS, shown at 714, negative during the interval because QHS is OFF. The switching voltage VSW, shown at 716, starts at zero and decreases a small (e.g., a diode drop) responsive to QLS entering third quadrant conduction when QLS is turned off. The low-side sense voltage VSNS,LS, shown at 718 remains at zero (e.g., ground) because VSW is not changing (or changes slightly due to body diode conduction of QLS) during turn off of QLS. Because VSW remains unchanging when QLS is off, low-side slew control circuitry 130 does not implement slew rate control for the conditions of FIG. 7. Instead, slew rate control will be implemented when QHS is turned on, such as shown in FIG. 8.

Figure 8:
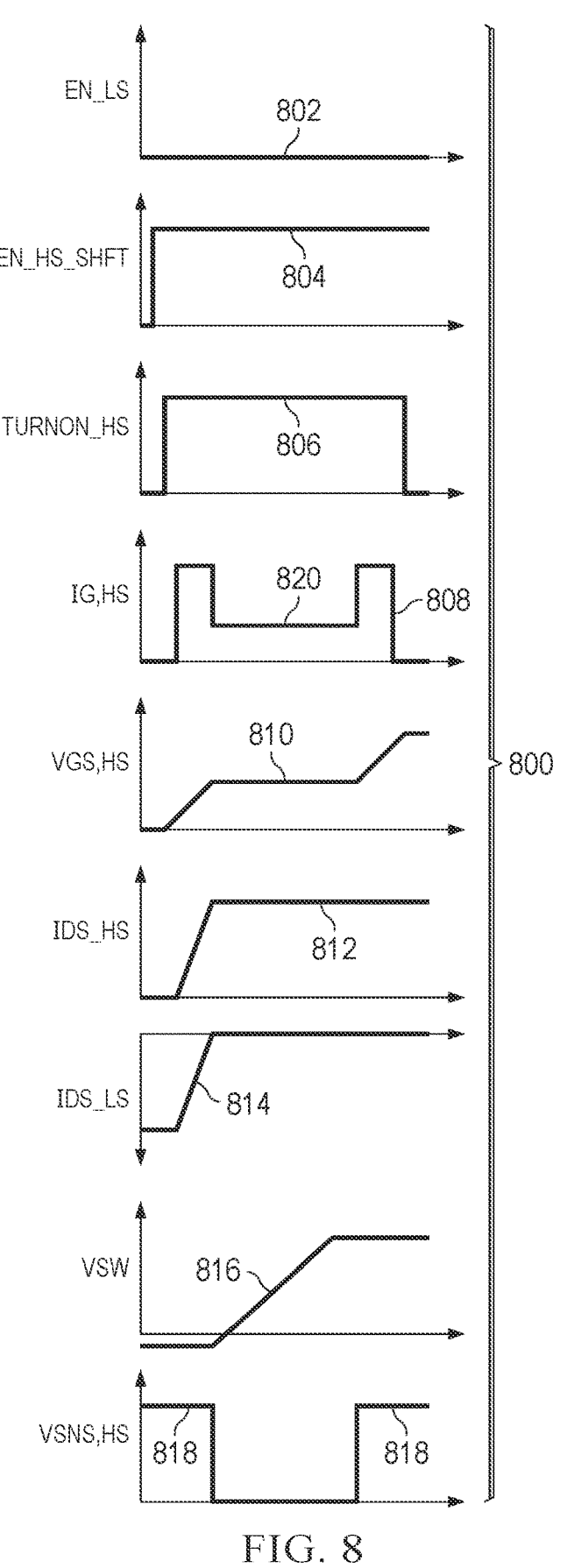

FIG. 8 illustrates signal waveforms 800 for a switching transition during a time interval when QHS is turned on (e.g., S1 and S3 are closed) and IL is positive (e.g., IL is flowing from 110 to 208). In FIG. 8, an enable low-side signal EN_LS 802 remains low during the time interval. An enable high-side shift signal EN_HS_SHFT 804 (provided by controller/level shifter 158) goes high, which is representative of a command to turn on QHS. The turn on low-side signal TURNON_HS 806 (provided to control input 278) goes high responsive to EN_HS 802 going high. For example, switches S2 and S3 close responsive to the TURNON_HS signal 806. The current source 210 is enabled to supply gate current signal IG,HS (at 114), shown at 808, responsive to the enable signal EN_HICUR1 signal. A gate-to-source voltage for QHS, shown at VGS,HS 810 (between terminals 112 and 106), is provided responsive to the gate current signal IG,HS 808. The drain-to-source current IDS_HS, shown at 812 (between terminals 102 and 106), increases from zero to a positive DC current. Concurrently with the change in IDS_HS, the low-side drain-to-source current IDS_LS, shown at 814, increases from a negative DC current to zero. The switching voltage VSW, shown at 816, likewise increases responsive to QHS being turned on. The increasing switching voltage VSW coincides with the Miller plateau of VGS,HS, shown at 810. The high-side sense voltage VSNS,HS, shown at 818, is high (e.g., approximately VDD,HS) until the increasing switching voltage VSW during the Miller plateau, which causes VSNS,HS to decrease ground. For example, the buffer 218 detects the change in VSNS,HS to ground and causes the current source 210 to reduce current The change in VSNS, HS. Thus, the high-side slew control circuitry 120 is configured to implement slew control by decreasing the high-side gate current IG,HS, shown at 820, responsive to sensing the increasing switching voltage VSW (during the Miller plateau of VGS,HS), which is detected at VSNS,HS.

Figure 9:
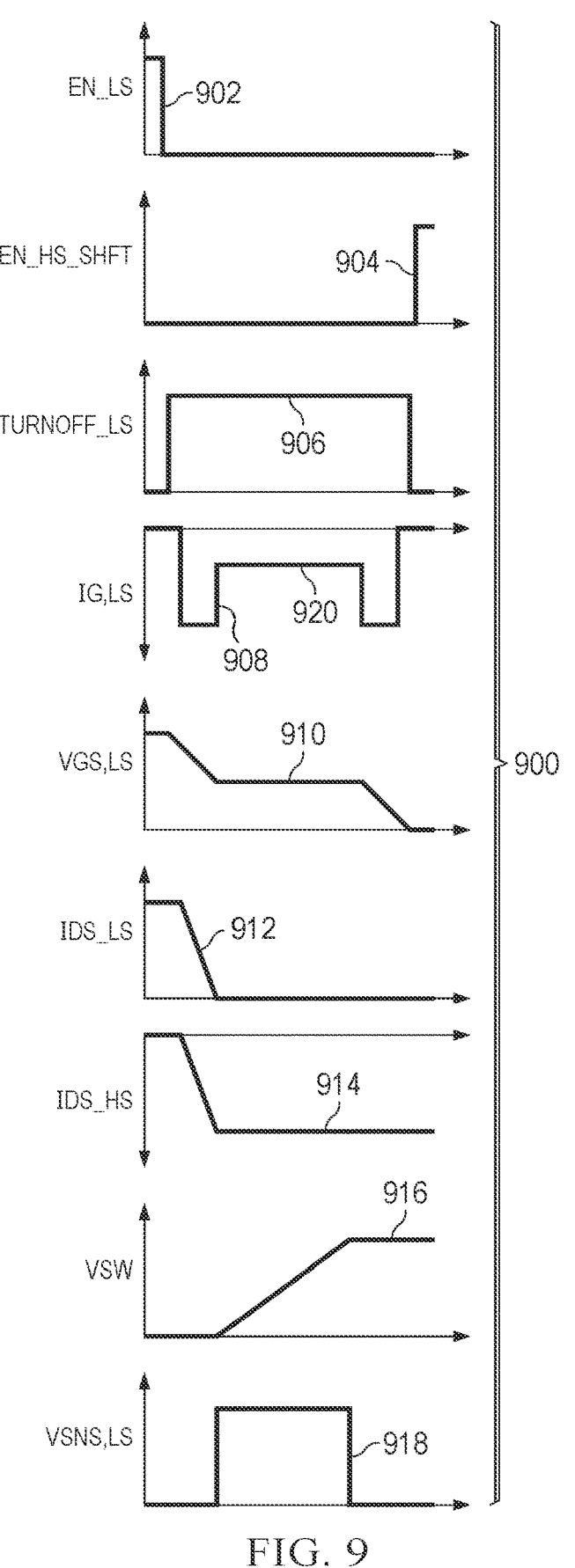

FIG. 9 illustrates signal waveforms 900 for a switching transition during a time interval when QLS is turned off and current IL is negative (e.g., IL is flowing from 208 to 110). In FIG. 9, the enable low-side signal EN_LS (from controller 140, 280), shown at 902, goes low. The EN_LS signal causes the turn off low-side signal TURNOFF_LS (provided to control input 240), shown at 906, to go high. The enable high-side shift signal EN_HS_SHFT 904 (provided by level shifter 158) remains low during the time interval, after which it goes high for turning on QHS. The gate current signal IG,LS (provided at 114), shown at 908, goes negative responsive to the signal TURNOFF_LS 906 activating the current source 252 to sink current from the gate 114. A low-side gate-to-source voltage VGS,LS (between terminals 114 and 104), shown at 910, decreases responsive to the gate current signal IG,LS 908. For example, VGS,LS 910 decreases until QLS reaches its Miller plateau responsive to the negative gate current. The drain-to-source current IDS_LS (between terminals 108 and 104), shown at 912, decreases to zero (e.g., IDS_LS=0) at which time (during the Miller plateau) current is no longer flows through QLS. Concurrently with the change in IDS_LS, inductor current IL still flows due to the low-side drain-to-source current IDS_HS 914 going negative responsive to conduction of current through the body diode of QHS. The switching voltage VSW, shown at 916, remains at 0 V until when VSW begins to increase during the Miller plateau of VGS,LS 910. Also, FIG. 9 shows the low-side sense voltage VNS_LS 918 is at VDD,LS responsive to detecting the rising VSW (e.g., during the Miller Plateau). The low-side slew control circuitry 130 is configured to implement slew control by reducing the low-side gate current IG,LS (e.g., by buffer 268 increasing IG_OFF), shown at 920, responsive to the low-side sense voltage VNS_LS 918, which is representative of the increasing switching voltage VSW.

Figure 10:
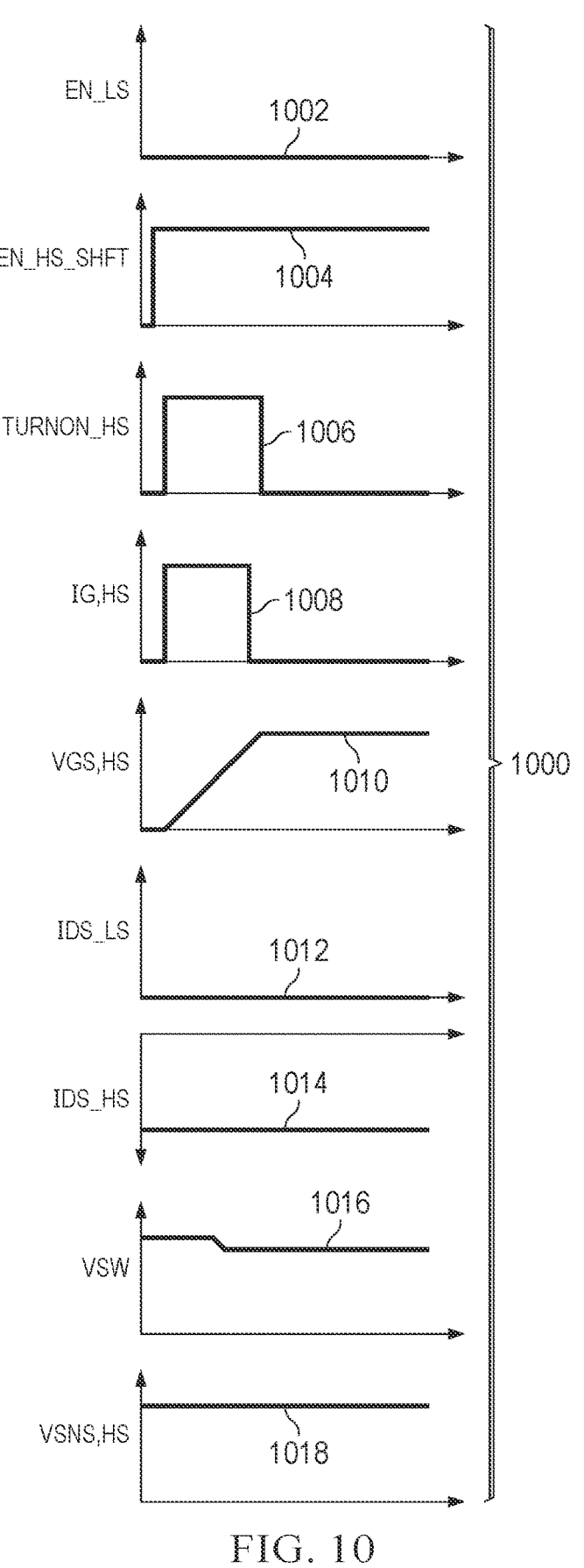

FIG. 10 illustrates signal waveforms 1000 for a switching transition during a time interval when QHS is turned on and IL is negative (e.g., IL is flowing from 208 to 110). In FIG. 10, an enable low-side signal EN_LS 1002 (at 144) remains low (off). The enable high-side shift signal EN_HS_SHFT (provided by level shifter 158), shown at 1004, goes high. EN_HS_SHFT 1004 going high causes the TURNON_HS signal 1006 to also go high, which results in the high-side gate current signal IG,HS (provided to the high-side gate 112) going positive, as shown at 1008. For example, switches S2 and S3 close responsive to the TURNON_HS signal 1006, which causes the current source 210 to supply current to the gate 112. A gate-to-source voltage for QHS, shown at VGS,LS 1010 (between terminals 112 and 106) increases responsive to the gate current signal IG,HS 1008. The low-side drain-to-source current IDS_LS (between terminals 108 and 104), shown at 1012, remains at zero during the interval shown in FIG. 10 when QHS is being turned on. Conversely, the high-side drain-to-source current IDS_HS, shown at 1014, is negative due to the negative inductor current IL flowing through the body diode of QHS. The switching voltage VSW, shown at 1016, starts positive and decreases a small amount (e.g., a diode drop) lower than VDC responsive to QLS operating in its third quadrant (e.g., quasi-body diode conduction). The high-side sense voltage VSNS,HS, shown at 1018, remains at VDC because VSW is not changing. As a result, the high-side slew control circuitry 120 does not adjust the slew rate. Instead, slew rate control is performed during the time interval when the QLS is turned off, such as shown with respect to FIG. 9.

Figure 11:
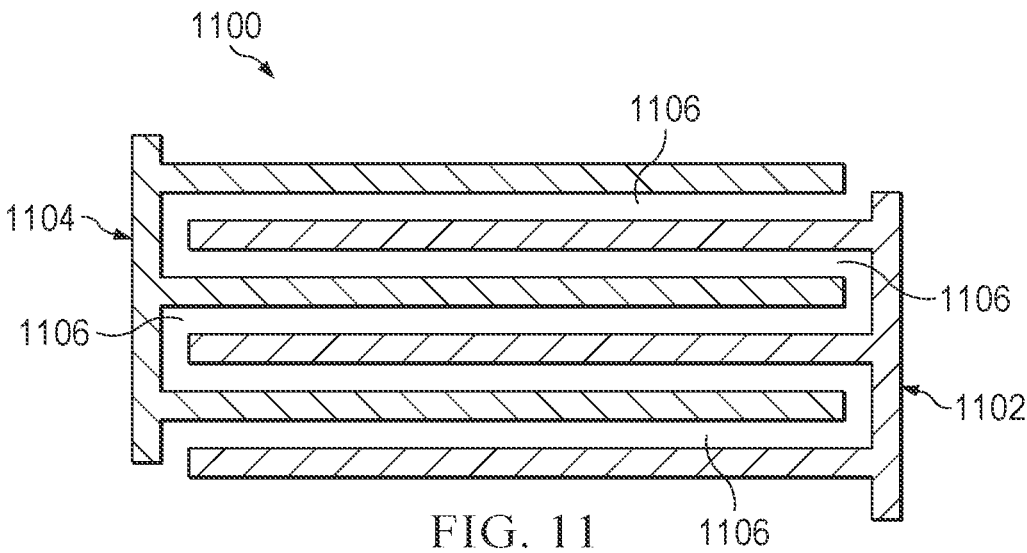
FIG. 11 is a simplified top view of an example capacitor.

FIG. 11 is a top view showing an example of a capacitor 1100, which can be used to implement the slew capacitor C_SLEW of FIGS. 1 and 2. The capacitor 1100 includes first and second electrode structures 1102 and 1104 formed of a conductive material, such as a metal (e.g., aluminum). The electrode structures 1102 can be formed as one or more lines within one or more conductive layers during a semiconductor fabrication process. In the example of FIG. 11, the electrode structures 1102 and 1104 include interdigitated lines formed of within the same level (intralevel) of metallization. The lines of the respective electrodes 1102 and 1104 can have a thickness configured according to the voltage and/or current requirements for the capacitor 1100. The lines of the respective electrodes 1102 and 1104 further can be separated by a dielectric material (e.g., silicon nitride), show as 1106 between respective lines of the electrodes. In other examples, the electrode structures 1102 and 1104 can be formed within more than one metal layer, such as by implementing inter-level metallization (e.g., including MET2 and MET3 or MET1 and MET2). As a further example, the capacitor 1100 is implemented according the description in U.S. Patent Application Publication No. 2022/0208755, which is incorporated herein by reference in its entirety.

Figure 12:
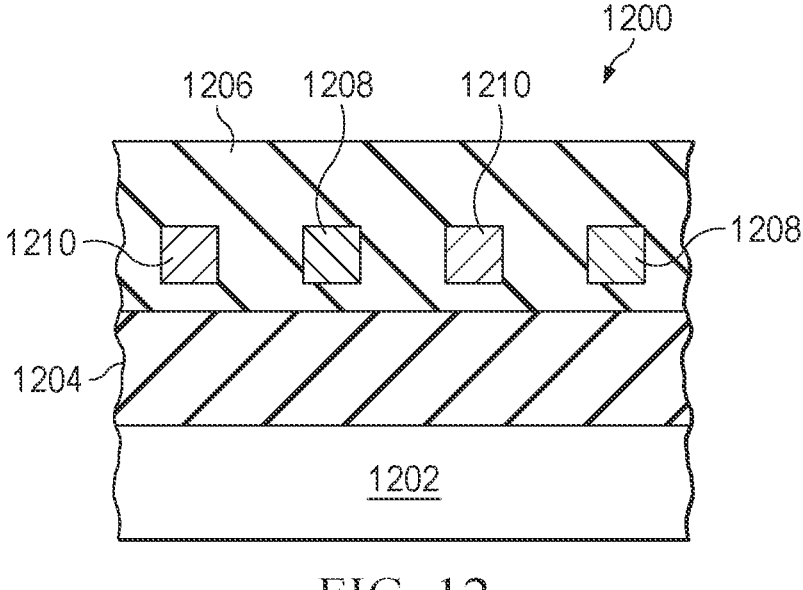
FIG. 12 is a cross-sectional view of an example capacitor formed in an IC die.

FIG. 12 is a cross-sectional view of part of an example capacitor 1200, such as the capacitor of FIG. 11. For example, the capacitor 1200 is monolithically formed on a silicon Si substrate 1202, such as a doped Si substrate. A layer 1204 of gallium nitride GaN can be formed over the substrate 1202. A non-conductive (insulating) layer 1206 of a dielectric material can be formed over the layer 1204. For example, the layer 1206 of dielectric material includes $SiO_2$, or SiON, or any low-k or high-k dielectrics or silicon nitride ($Si_3N_4$). The capacitor 1200 also includes a first electrode structure 1208 formed of a metal layer and a second electrode structure 1210 formed of the same metal layer, both of which are formed within the layer 1206. For example, the metal layer used for the electrode structures 1208 and 1210 can be aluminum material (e.g., aluminum or an alloy thereof) or another conductive material (e.g., gold, silver, nickel, etc.).

Figure 13:
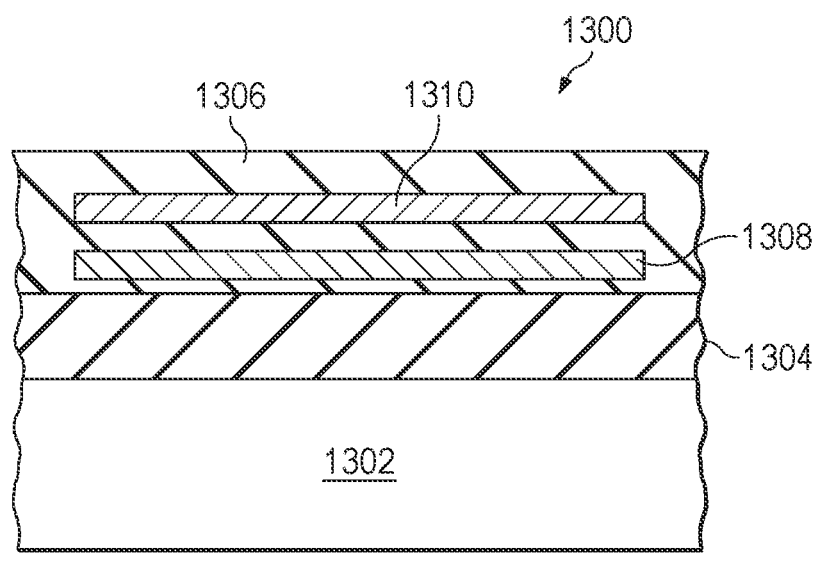
FIG. 13 is a cross-sectional view of another example capacitor formed in an IC die.

FIG. 13 is cross-sectional view of part of another example capacitor 1300. For example, the capacitor 1300 is monolithically formed on a silicon Si substrate 1302, such as a doped Si substrate. A layer 1304 of gallium nitride GaN can be formed over the substrate 1302. A non-conductive (insulating) layer 1306 of a dielectric material can be formed over the layer 1304. For example, the layer 1306 of dielectric material includes $SiO_2$, or SiON, or any low-k or high-k dielectrics or silicon nitride ($Si_3N_4$). The capacitor 1300 also includes a first electrode structure 1308 formed of a first metal layer and a second electrode structure 1310 formed of a second, different metal layer. In the example of FIG. 13, the electrode structures 1308 and 1310 can be respective parallel plates spaced apart from each other by a volume of the dielectric material. In another example, the electrode structures 1308 and 1310 can be formed as interdigitated lines of metal material in separate metal layers, which are spaced apart from each other by dielectric material. The metal layer used for the electrode structures 1308 and 1310 can be aluminum material or another conductive material.

By implementing the capacitor 1100 in one or more metallization layer of an IC die, the capacitor 1100 can be integrated monolithically with one or more other components of the power circuit 100 or 200 in an IC die. For example, the capacitor 1100 is formed on the same IC die with QLS. In another example, the capacitive device 1100 is formed on the same IC die with both transistors QLS and QHS.

Figure 14:
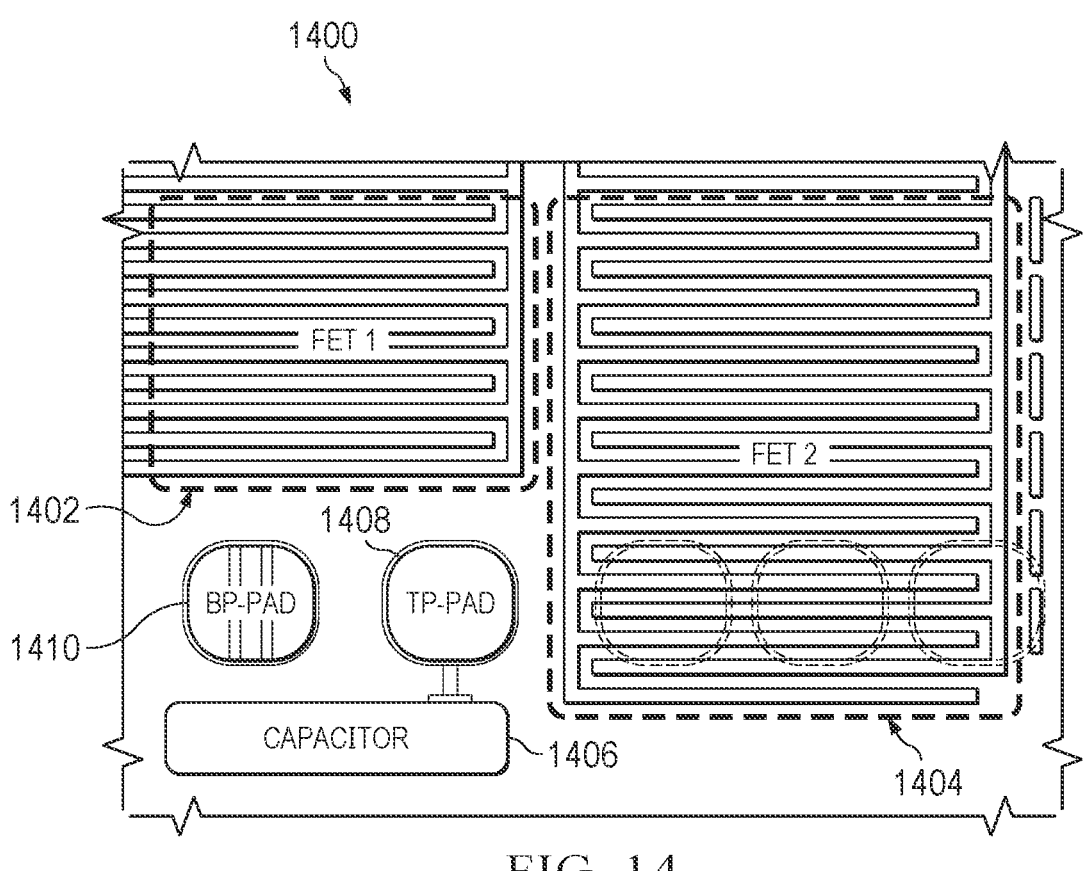
FIG. 14 is a top view of part of an integrated circuit die showing an example layout for components of a power circuit.

FIG. 14 depicts an example of a layout for part of an IC die 1400, which includes a first FET (FET1) 1402, a second FET (FET2) 1404 and a capacitor 1406. For example, the FETs 1402 and 1404 are the low-side and high-side FETs QLS and QHS, respectively, and the capacitor 1406 is the slew capacitor C_SLEW, as described herein. The capacitor 1406 thus can be implemented according to the examples described herein, including with respect to FIGS. 11, 12 and 13. The IC die 1400 can also include a top-plate bond pad 1408 (TP-pad), and a bottom-plate pad (BP-pad) 1410, which are coupled to respective top and bottom plates of capacitor 1406. By integrating the slew capacitor C_SLEW in a monolithic IC structure (e.g., an IC die or SoC) with one or more circuit components of the power circuit 100, 200, as described herein, improved slew control can be implemented for high voltage applications (e.g., greater than 400 V).

FIGS. 15, 16, 17 and 18 are flow diagrams showing examples of implementing slew control in a power circuit (e.g., half-bridge power stage) for different switching transitions for QHS and QLS. The methods of FIGS. 15, 16, 17 and 18 can be used to control slew for the circuits of FIGS. 1 and 2. Accordingly, the description of FIGS. 15, 16, 17 and 18 also refers to FIGS. 1 and 2.

Figure 15:
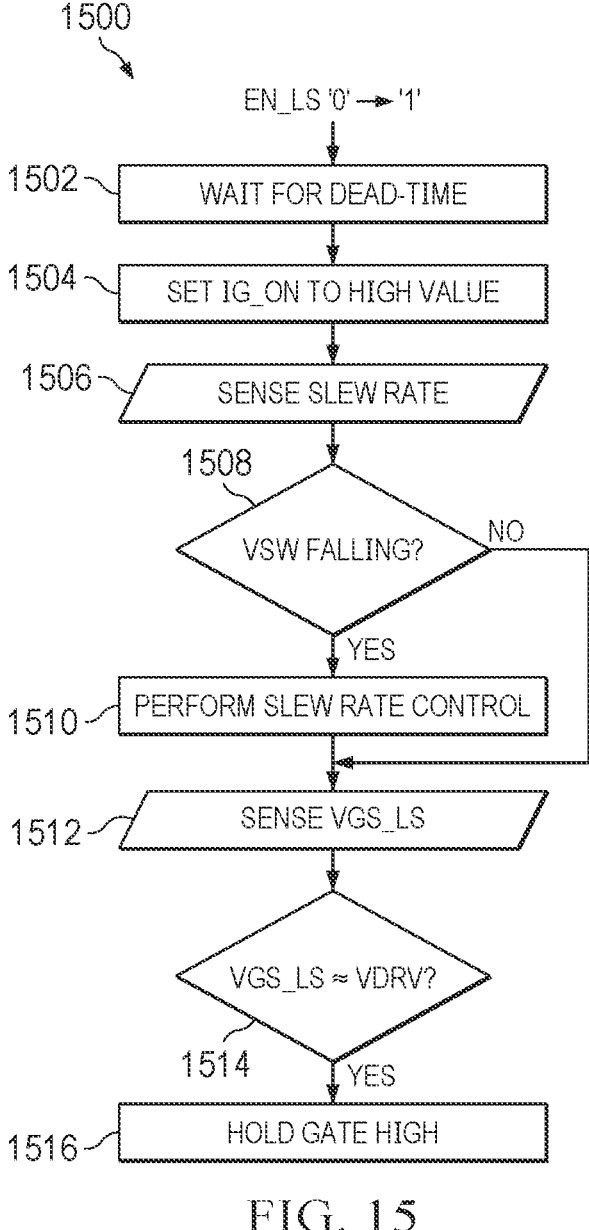
FIG. 15 is a flow diagram showing an example method for implementing slew control for a first low-side switching condition.

FIG. 15 is a flow diagram for an example method 1500 for implementing slew rate control for a switching transition when the low-side transistor QLS is turned on, such as responsive to the enable low-side signal EN_LS (e.g., changing from logic '0' to '1'). At 1502, the circuit 100, 200 waits a dead-time interval responsive to the enable low-side signal EN_LS, such as for the control circuitry to propagate the command through the low-side slew control circuitry 130 and driver 132. At 1504, the gate turn on current is set to a high-value. For example, the current source 250 is enabled responsive to the EN_HICUR3 signal, which supplies current IG_ON at a high current value to the gate QLS. At 1506, slew rate is sensed. For example, the low-side slew control circuitry 130 senses VSNS,LS, which is representative of slew rate at the switching output 110. At 1508, a determination is made as to whether VSW is falling. Responsive to determining at 1508 that VSW is falling, the method proceeds to 1510. At 1510, the current source 250 is configured to implement slew rate control by supplying a low current value to the gate QLS responsive to the EN_LOCUR3 signal. From 1510 the method proceeds to 1512. Also, from 1508 responsive to determining at 1508 that VSW is not falling, the method proceeds to 1512 and slew rate control is not implemented. At 1512, the low-side gate-to-source voltage VGS,LS is sensed. At 1514, a determination is made as to whether the low-side gate-to-source voltage VGS,LS approximates the reference drive voltage VDRV. For example, VDRV is the nominal turn on voltage which is used to achieve minimum conduction losses for QLS. Responsive to determining that the low-side gate-tosource voltage VGS,LS approximates the reference drive voltage VDRV, the method proceeds to 1516 and the gate voltage is held high to keep QLS turned on.

Figure 16:
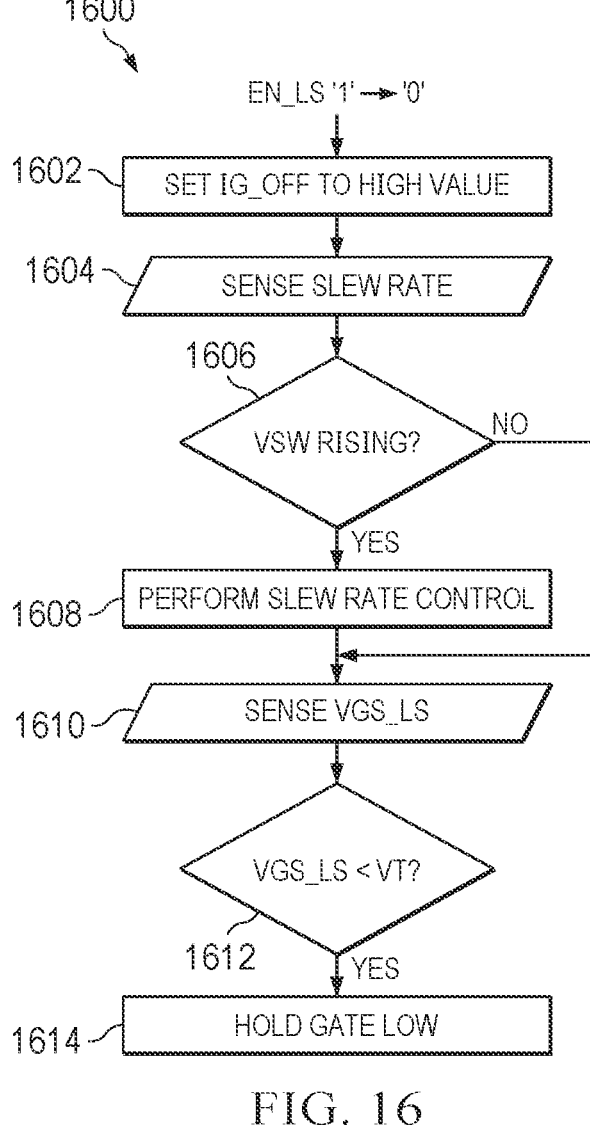
FIG. 16 is a flow diagram showing an example method for implementing slew control for a second low-side switching condition.

FIG. 16 is a flow diagram for an example method 1600 for implementing slew rate control for a switching transition when the low-side transistor QLS is turned off, such as responsive to the enable low-side signal EN_LS (e.g., changing from logic '1' to '0'). At 1602, the low-side gate turn off current is set to a high-value. For example, the current source 252 is enabled responsive to the EN_HI-CUR4 signal, which supplies current IG_OFF at a high current value to the gate QLS. At 1604, slew rate is sensed. For example, the low-side slew control circuitry 130 senses VSNS,LS, which is representative of slew rate at the switching output 110. In the example of FIG. 16, the slew rate is negative. At 1606, a determination is made as to whether VSW is rising. Responsive to determining at 1606 that VSW is rising, the method proceeds to 1608. At 1608, the current source 250 is configured to implement slew rate control. For example, switch S8 is closed to couple low-side sense input 276 at the input of buffer 268 responsive to the TURNOF-F_LS signal, and buffer 268 provides EN_LOCUR4 to current source 252 for supplying a low current value to the gate QLS. From 1608 the method proceeds to 1610. Also, from 1606 responsive to determining that VSW is not rising, the method proceeds to 1610, in which slew rate control is not implemented. At 1610, the low-side gate-to-source voltage VGS,LS is sensed. At 1614, a determination is made as to whether the low-side gate-to-source voltage VGS,LS is less than a reference voltage VT. For example, VT is the threshold voltage for QLS. Responsive to determining that the low-side gate-to-source voltage VGS,LS is less than VT, the method proceeds to 1616 and the gate voltage is held low to keep QLS turned off.

Figure 17:
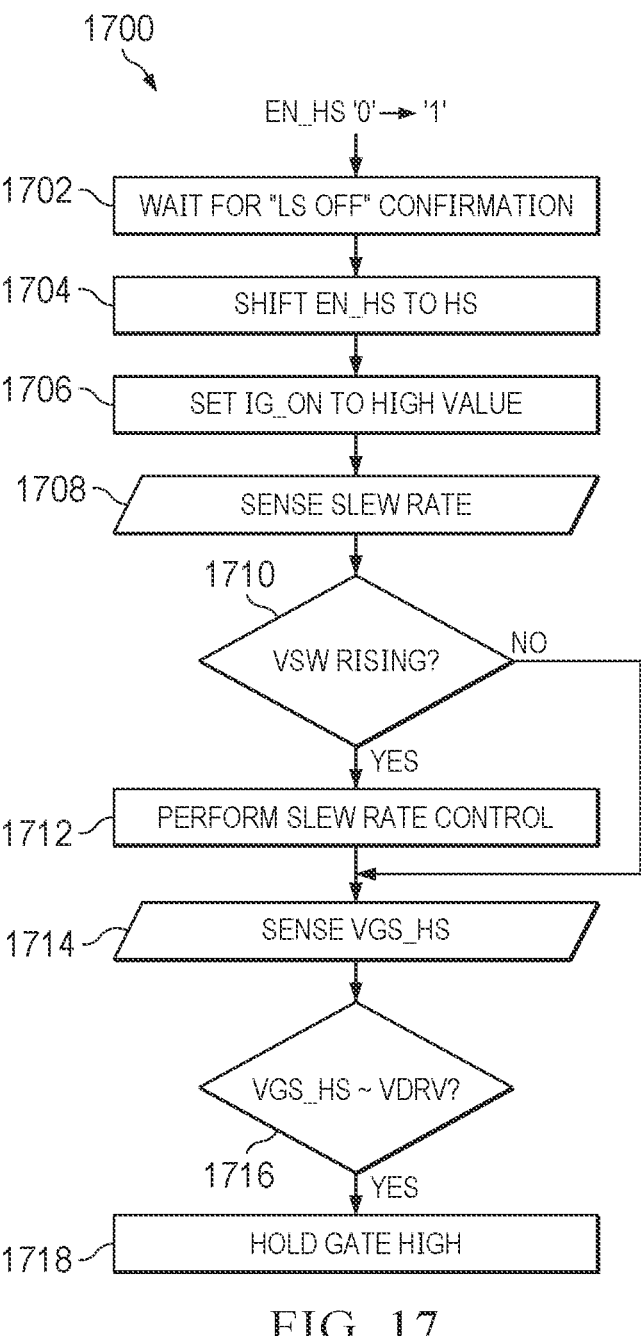
FIG. 17 is a flow diagram showing an example method for implementing slew control for a first high-side switching condition.

FIG. 17 is a flow diagram for an example method 1700 for implementing slew rate control for a switching transition when the high-side transistor QHS is turned on, such as responsive to the enable high-side signal EN_HS (e.g., changing from logic '0' to '1'). At 1702, the circuit 100, 200 waits for confirmation that the low-side has turned off, such as implemented by non-overlap circuit 146 responsive to the enable high-side signal EN_HS. At 1704, the level shifted high-side enable signal EN_HS_SHFT can be provided to high-side circuitry. For the example where the high-side control circuit 116 is implemented on a separate die, the signals can be communicated through an inter-die communication link, such as described herein. At 1706, the gate turn on current IG_ON is set to a high value. For example, the current source 210 is enabled responsive to the EN_HI-CUR1 signal, which supplies current IG_ON at a high current value to the gate QHS. At 1708, slew rate is sensed. For example, the high-side slew control circuitry 120 senses VSNS,HS, which is representative of slew rate at the switching output 110, and is supplied to the input 246 through S3 for controlling the current IG_ON. In the example of FIG. 17, the slew rate is positive. At 1710, a determination is made as to whether VSW is rising. Responsive to determining that VSW is rising, the method proceeds to 1712. At 1712, the current source 210 is configured to implement slew rate control. For example, switch S3 is closed to couple high-side sense input 238 at the input of buffer 218 responsive to the TURNON_HS signal, and the buffer provides EN_LOCUR1 to current source 210 for supplying a low current value according to slew rate requirements. From 1712 the method proceeds to 1714. Also, from 1710 responsive to determining that VSW is not rising, the method proceeds to 1714 and slew rate control is not implemented.

At 1714, the high-side gate-to-source voltage VGS,HS is sensed. At 1716, a determination is made as to whether the high-side gate-to-source voltage VGS,HS approximates a reference drive voltage VDRV. Responsive to determining that the high-side gate-to-source voltage VGS,HS approximates VDRV, the method proceeds to 1718 and the gate voltage is held high to keep QHS turned on.

Figure 18:
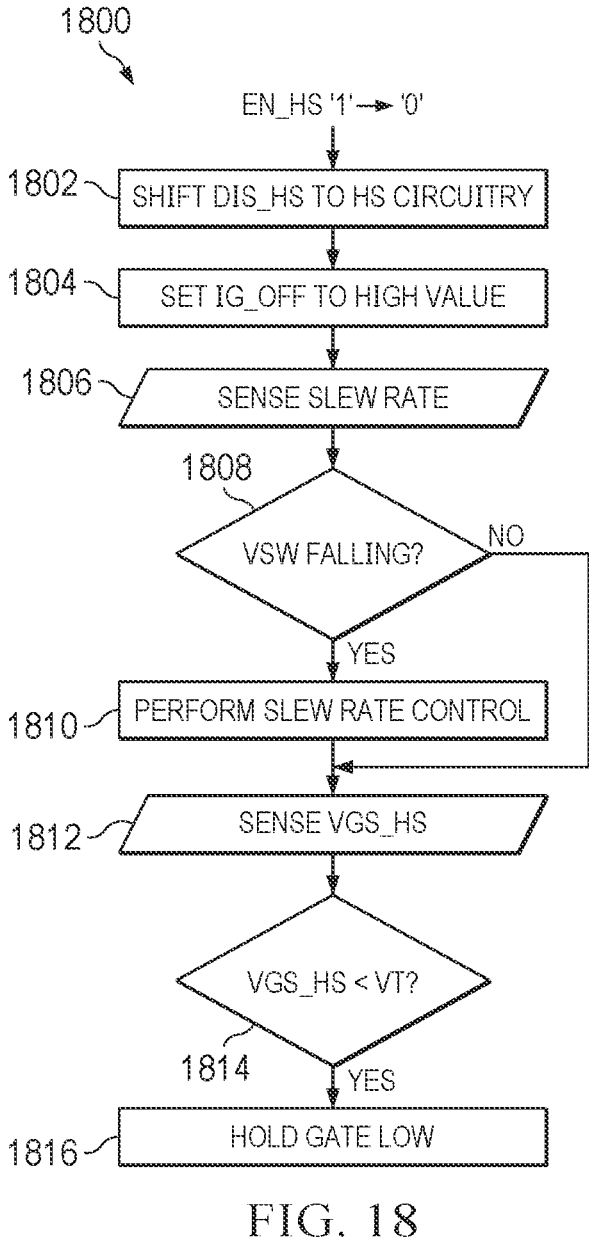
FIG. 18 is a flow diagram showing an example method for implementing slew control for a second high-side switching condition.

FIG. 18 is a flow diagram for an example method 1800 for implementing slew rate control for a switching transition when the high-side transistor QHS is turned off, such as responsive to the enable high-side signal EN_HS (e.g., changing from logic '1' to '0'). At 1802, a level-shifted high-side disable signal can be provided to high-side circuitry. For the example where the high-side control circuit 116 is implemented on a separate die from the controller that generates EN_HS, the signals can be communicated (e.g., shifted) through an inter-die communication link, such as described herein. At 1804, the gate turn off current IG_OFF is set to a high value. For example, the current source 220 is enabled responsive to the EN_HICUR2 signal, which supplies current IG_OFF at a high current value to the gate QHS. At 1806, slew rate is sensed. For example, the high-side slew control circuitry 120 senses VSNS,HS, which is representative of slew rate at the switching output 110, and is supplied to the input 248 through S4 for controlling the current IG_OFF. In the example of FIG. 18, the slew rate is negative. At 1808, a determination is made as to whether VSW is falling. Responsive to determining that VSW is falling, the method proceeds to 1810. At 1810, the current source 220 is configured to implement slew rate control. For example, the high-side sense input 238 is coupled to the buffer input 248 responsive to the TURNOFF_HS signal, and the buffer provides EN_LOCUR2 to current source 210 for supplying a low current value according to slew rate requirements. From 1810 the method proceeds to 1812. Also, from 1808 responsive to determining that VSW is not falling, the method proceeds to 1812 and slew rate control is not implemented. At 1812, the high-side gate-to-source voltage VGS,HS is sensed. At 1814, a determination is made as to whether the high-side gate-to-source voltage VGS,HS approximates a reference drive voltage VDRV. Responsive to determining that the high-side gate-to-source voltage VGS,HS is less than a reference voltage VT. Responsive to determining that the high-side gate-to-source voltage VGS, HS is less than VT, the method proceeds to 1816 and the gate voltage is held low to keep QHS turned off.

In this description, numerical designations "first", "second", etc. are not necessarily consistent with same designations in the claims herein. Additionally, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A circuit comprising:
   a driver having a drive input and a drive output; and
   a control circuitry having a sense terminal and a control output, the sense terminal coupled to a transistor current terminal, the control output coupled to the drive input, the slew-control circuitry configurable to:
   responsive to a state of the sense terminal indicating a state change of the transistor current terminal, cause the driver to provide a first current at the drive output; and
   responsive to the state of the sense terminal indicating that the transistor current terminal is in a particular state, cause the driver to provide a second current at the drive output, the second current being lower than the first current.

2. The circuit of claim 1, wherein the control circuitry includes:
   a first switch and a first resistor coupled between a first voltage input and the sense terminal, the first switch having a first switch control input; and
   a second switch and a second resistor coupled between the sense terminal and the transistor current terminal, the second switch having a second switch control input.

3. The circuit of claim 2, wherein the drive input is a first drive input, the driver has a second drive input, the control output is a first control output coupled to the first drive input, the control circuitry has a second control output coupled to the second drive input and includes:
   a first buffer having a first buffer input and a first buffer output, the first buffer output coupled to the first control output;
   a third switch coupled between the sense terminal and the first buffer input, the third switch having a third switch control input coupled to the first switch control input;
   a second buffer having a second buffer input and a second buffer output, the second buffer output coupled to the second control output; and
   a fourth switch coupled between the sense terminal and the second buffer input, the fourth switch having a fourth control switch input coupled to the second switch control input.

4. The circuit of claim 3, wherein the driver comprises:
   a first current source having a first current control input and a first current output, the first current control input coupled to the first drive input, and the first current output coupled to the drive output; and a second current source having a second current control input and a second current output, the second current control input coupled to the second drive input, and the second current output coupled to the drive output.

5. The circuit of claim 1, further comprising a first transistor coupled between a power terminal and a switching terminal, and a second transistor coupled between the switching terminal and a reference terminal, the first transistor having a first control terminal, the second transistor having a second control terminal, wherein the drive output is coupled to one of the first or second control terminals, and the sense terminal is coupled to the switching terminal.

6. The circuit of claim 5, wherein the driver is a first driver, the drive input is a first drive input, the drive output is a first drive output coupled to the first control terminal;

wherein the control circuitry is a first control circuitry, the sense terminal is a first sense terminal, and the control output is a first control output;

wherein the circuit further comprises:

a second driver having a second drive input and a second drive output, the second drive output coupled to the second control terminal; and a second control circuitry having a second sense terminal and a second control output, the second sense terminal coupled to the first sense terminal, the second control output coupled to the second drive input, and the second control circuitry configurable to:

responsive to a state of the second sense terminal indicating the state change of the transistor current terminal, cause the second driver to provide a third current at the second drive output; and responsive to the state of the second sense terminal indicating that the transistor current terminal is in a particular state, cause the second driver to provide a fourth current at the second drive output, the fourth current being lower than the third current.

7. The circuit of claim 6, further comprising a capacitor coupled between the first and second sense terminals.

8. The circuit of claim 7, wherein the capacitor has a linear capacitance configurable to translate a slew rate at the first and second drive outputs to a respective current representative of the slew rate.

9. The circuit of claim 7, wherein the circuit comprises an integrated circuit die including the capacitor and at least one of the first or second transistors.

10. The circuit of claim 9, wherein the integrated circuit die is a first integrated circuit die including the second transistor and the capacitor, and the first transistor, the first driver and the second driver are on a second integrated circuit die.

11. The circuit of claim 9, wherein the first transistor, the first driver and the second driver are on the integrated circuit die including the second transistor and the capacitor.

12. The circuit of claim 5, wherein the first and second transistors form a half-bridge circuit.

13. The circuit of claim 1, wherein the sense terminal is coupled to a capacitor terminal.

14. The circuit of claim 1, wherein the sense terminal is coupled to the transistor current terminal via a resistor and a switch.

15. A circuit comprising:

a first transistor coupled between a power terminal and a switching terminal, the first transistor having a first control terminal;

a second transistor coupled between the switching terminal and a reference terminal, the second transistor having a second control terminal;

a first driver having a first drive input and a first drive output, the first drive output coupled to the first control terminal;

a second driver having a second drive input and a second drive output, the second drive output coupled to the second control terminal;

a first control circuitry having a first sense terminal and a first control output, the first sense terminal coupled to the switching terminal, and the first control output coupled to the first drive input, the first control circuitry configurable to:

responsive to a state of the first sense terminal indicating a state change of the switching terminal, cause the first driver to provide a first current at the first drive output; and responsive to the state of the first sense terminal indicating that the switching terminal is in a particular state, cause the first driver to provide a second current at the first drive output, the second current being lower than the first current; and a second control circuitry having a second sense terminal and a second control output, the second sense terminal coupled to the first sense terminal, and the second control output coupled to the second drive input, the second control circuitry configurable to:

responsive to a state of the second sense terminal indicating the state change of the switching terminal, cause the second driver to provide a third current at the second drive output; and responsive to the state of the second sense terminal indicating that the switching terminal is in the particular state, cause the second driver to provide a fourth current at the second drive output, the fourth current being lower than the third current.

16. The circuit of claim 15, further comprising a capacitor coupled between the first and second sense terminals.

17. The circuit of claim 16, wherein the capacitor is configurable to provide a current signal responsive to a first voltage at the first sense terminal and a second voltage at the second sense terminals.

18. The circuit of claim 16, wherein the first and second control circuitries are configurable to set a slew rate at the switching terminal responsive to a direction of a current signal into or out of the switching terminal.

19. The circuit of claim 16, wherein the first and second control circuitries are further configurable to set a slew rate at the switching terminal responsive to whether the respective first and second transistors are turning on or off and whether a voltage at the switching terminal is rising or falling.

20. The circuit of claim 16, wherein the capacitor and at least one of the first transistor or the second transistor are on an integrated circuit die.

21. A system comprising:

a first transistor coupled between a power terminal and a switching terminal, the first transistor having a first control terminal;

a second transistor coupled between the switching terminal and a reference terminal, the second transistor having a second control terminal;

a first driver having a first drive input and a first drive output, the first drive output coupled to the first control terminal;

a second driver having a second drive input and a second drive output, the second drive output coupled to the second control terminal;

an inductor coupled between the switching terminal and an output terminal;

a first slew control circuitry having a first control input, a first sense terminal, and a first control output, the first sense terminal coupled to the switching terminal, the first control output coupled to the first drive input;

a second slew control circuitry having a second control input, a second sense terminal, and a second control output, the second sense terminal coupled to the first sense terminal, the second control output coupled to the second drive input;

a capacitor coupled between the first and second sense terminals; and a controller having outputs coupled to the first and second control inputs.

22. The system of claim 21, wherein the capacitor and at least one of the first or second transistors are integrated on an integrated circuit die.

23. The system of claim 22, wherein the controller is configurable to provide a first enable signal to control a state of the first transistor, and a second enable signal to control a state of the second transistor.

24. The system of claim 23, wherein:

the first slew control circuitry is configurable to provide a first sense signal at the first sense terminal responsive to the first enable signal and a voltage at the switching terminal; and the second slew control circuitry is configured to provide a second sense signal at the second sense terminal responsive to the second enable signal and the voltage.

25. The system of claim 24, wherein:

the capacitor is configurable to conduct a current representative of a slew rate at the switching terminal, and each of the first and second sense signals has a voltage responsive to the current through the capacitor.

26. The system of claim 21, wherein the first slew control circuitry is configurable to:

responsive to a state of the first sense terminal indicating a state change of the switching terminal, and a state of the first control input, cause the first driver to provide a first current at the first drive output; and responsive to the state of the first sense terminal indicating that the switching terminal is in a particular state, and a state of the first control input, cause the first driver to provide a second current at the first drive output, the second current being lower than the first current; and wherein the second slew control circuitry is configurable to:

responsive to a state of the second sense terminal indicating the state change of the switching terminal, and a state of the second control input, cause the second driver to provide a third current at the second drive output; and responsive to the state of the second sense terminal indicating that the switching terminal is in the particular state, and a state of the second control input, cause the second driver to provide a fourth current at the second drive output, the fourth current being lower than the third current.

* * * * *